United States Patent
Tsuruoka

(10) Patent No.: US 8,014,739 B2
(45) Date of Patent: Sep. 6, 2011

(54) RADIO TERMINAL AND TRANSMISSION POWER CONTROL METHOD

(75) Inventor: Tetsumei Tsuruoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 417 days.

(21) Appl. No.: 12/393,178

(22) Filed: Feb. 26, 2009

(65) Prior Publication Data
US 2009/0227217 A1 Sep. 10, 2009

(30) Foreign Application Priority Data

Mar. 4, 2008 (JP) ................................. 2008-053336

(51) Int. Cl.
*H04B 1/04* (2006.01)
(52) U.S. Cl. .................................. 455/127.2; 455/127.3
(58) Field of Classification Search ............... 455/114.2, 455/115.1, 127.1, 127.2
See application file for complete search history.

(56) References Cited

U.S. PATENT DOCUMENTS

| | | | |
|---|---|---|---|
| 6,675,000 B1 | 1/2004 | Ichikawa | |
| 7,738,845 B2 * | 6/2010 | Takahashi et al. ............ | 455/126 |
| 7,924,939 B2 * | 4/2011 | Kim et al. ..................... | 375/295 |
| 2002/0013157 A1 | 1/2002 | Ichikawa | |
| 2006/0057981 A1 | 3/2006 | Tsuda | |

FOREIGN PATENT DOCUMENTS

| | | |
|---|---|---|
| JP | 11-355205 | 12/1999 |
| JP | 2000-196521 | 7/2000 |
| JP | 2001-358601 | 12/2001 |
| JP | 2004-274390 | 9/2004 |

* cited by examiner

*Primary Examiner* — Hai L Nguyen
(74) *Attorney, Agent, or Firm* — Katten Muchin Rosenman LLP

(57) ABSTRACT

A radio terminal includes a first part that has a first gain switchable between first and second levels, a second part that continuously controls a second gain, and a control part. A first range of the combined gain of the first and second gains obtained by the second part with the first gain set at the first level and a second range of the combined gain obtained by the second part with the first gain set at the second level have at least an overlap. The control part switches the first gain from one to the other of the first and second levels if the combined gain is within the overlap and a change in the combined gain exceeds a predetermined value, or if the combined gain is within the overlap and the radio terminal is in a period of no transmission or reception in intermittent transmission or reception.

7 Claims, 15 Drawing Sheets

RADIO TERMINAL AND TRANSMISSION POWER CONTROL METHOD

BACKGROUND OF THE INVENTION

1. Field of the Invention

The present invention relates to a radio terminal and a transmission power control method employed in a radio communications system.

2. Description of the Related Art

Lately, radio communications systems that can achieve high communication speeds between a base station (BS) and a mobile station (MS) (radio terminal) have been proposed or standardized because of technological progress in radio communications.

Examples of these radio communications systems include Mobile WiMAX (Worldwide Interoperability for Microwave Access) (hereinafter referred to as WiMAX), which has been standardized as IEEE 802.16e in recent years. In WiMAX, Orthogonal Frequency Division Multiple Access (OFDMA) is adopted, and it is possible to increase communication speed by using a large number of subcarriers modulated at a high coding rate. Examples of modulation systems include 64QAM (Quadrature Amplitude Modulation). Further, WiMAX achieves sharing the same frequency band between multiple radio terminals (MSs). For example, according to WiMAX, a frame is divided into regions called "bursts" determined by both Frequency Division Duplex (FDD) and Time Division Duplex (TDD).

WiMAX adopts such a multiplexing system. A BS simultaneously receives electric waves from multiple MSs, and demodulates them at the same time. Therefore, the reception levels of the electric waves from the MSs are desired to be uniform at a certain level in the BS. Transmission power control (TPC) is commonly applied in order to make the MS reception levels uniform at a certain level in the BS. TPC is a control protocol that controls transmission power between the BS and MS. The MS controls power suitably based on TPC. Here, when TPC is applied in mobile communications, the MS may be positioned near or far from the BS. In order for the MS to have appropriate power for reaching the BS in such an environment, it is desirable that the MS can control transmission power level continuously over a wide range.

For example, the MS includes multiple variable gain amplifiers, and has these variable gain amplifiers arranged at cascade connection. Thereby, the MS can widen a power control range and therefore can have a wide output range.

Reference may be made to Japanese Laid-Open Patent Application No. 2001-358601 for related art.

However, it is costly in terms of components to provide an amplifier or attenuator having a mechanism for continuously varying output gain. Accordingly, in the case of providing the MS with two amplifiers, one of the two amplifiers may be a dual gain amplifier which has a varying mechanism simple enough to be able to switch gain between two levels. Thereby, it is possible to reduce component cost.

For example, in the case of using a transmission amplifier that includes a continuously variable gain amplifier whose range of gain control is 40 dB and a dual gain amplifier which is capable of switching attenuation between 0 dB and −20 dB, a maximum gain control width (range) of 60 dB can be obtained.

The above-described background art, however, has problems such as the following.

A description is given of the case where the MS has two variable gain amplifiers and there is a large difference in levels between which the gain is switched in one of the two variable gain amplifiers.

In this case, a discontinuity in transmission power is prone to occur at a gain switch point in the variable gain amplifier having a large difference in levels between which the gain is switched.

By way of example, a description is given of the case of obtaining a transmission power level lower by 30 dB than a maximum gain. In this case, the following two setups may be chosen: one is to set the gain of the dual gain amplifier at 0 dB and reduce the gain by 30 dB in the amplifier capable of continuously varying the gain, and the other is to set the gain of the dual gain amplifier at −20 dB and reduce the gain by 10 dB in the amplifier capable of continuously varying the gain. However, there may not be matching in the difference in attenuation of 20 dB at the continuously variable gain side and the difference of the gain between the low gain and the high gain at the dual gain amplifier because of the individual differences of components and environmental factors such as a difference in temperature. In this case, a step occurs in transmission power at the point of switching gain distribution.

In order to control this step in transmission power with such a technique as adjustment, a circuit for calibration may be added. This calibration circuit makes adjustments so as to make power uniform at two operating points. However, addition of such a calibration circuit, which requires implementation of an additional circuit and control process, is not desirable.

If the gain were switched in a continuously variable manner in each of the two variable gain amplifiers, such a point of discontinuity could be eliminated by performing such control as to control the gain of one of the two variable gain amplifiers while fixing the gain of the other one of the two variable gain amplifiers.

However, as previously mentioned, it is costly in terms of components to provide an amplifier or attenuator having a mechanism for continuously varying output gain.

SUMMARY OF THE INVENTION

Embodiments of the present invention may solve or reduce one or more of the above-described problems.

According to one embodiment of the present invention, a radio terminal and a transmission power control method are provided in which one or more of the above-described problems may be solved or reduced.

According to one embodiment of the present invention, a radio terminal and a transmission power control method are provided that can reduce the effect of discontinuous transmission power at the switching of gain in transmission power control.

According to one embodiment of the present invention, a radio terminal is provided that includes a first gain control part configured to have a first gain switchable between a first level and a second level; a second gain control part configured to continuously control a second gain; and a control part configured to control operations of the first gain control part and the second gain control part, wherein a first range of a combined gain of the first gain and the second gain, the first range being obtained with a gain control by the second gain control part with the first gain control part having the first gain set at the first level, and a second range of the combined gain, the second range being obtained with the gain control by the second gain control part with the first gain control part having the first gain set at the second level, have at least an overlap, and the control part is configured to switch the first gain from one of the first level and the second level to the other in response to the combined gain being within the overlap and a change in the combined gain exceeding a predetermined value, or in response to the combined gain being within the overlap and the radio terminal being in a period of no transmission or reception in a situation of intermittent transmission or reception.

According to one embodiment of the present invention, a radio terminal is provided that includes a first gain control part configured to have a first gain switchable between a first level and a second level; a second gain control part configured to continuously control a second gain; and a control part configured to control operations of the first gain control part and the second gain control part, wherein a first range of a combined gain of the first gain and the second gain, the first range being obtained with a gain control by the second gain control part with the first gain control part having the first gain set at the first level, and a second range of the combined gain, the second range being obtained with the gain control by the second gain control part with the first gain control part having the first gain set at the second level, have at least an overlap, and the control part is configured to set the first gain at the first level in the first gain control part in response to a desired level of the combined gain being in the overlap and a difference between the desired level of the combined gain and one of ends of the first range of the combined gain which one is nearer to the desired level being greater than a difference between the desired level of the combined gain and one of ends of the second range of the combined gain which one is nearer to the desired level.

According to one embodiment of the present invention, a radio terminal is provided that includes a first gain control part configured to have a first gain switchable between a first level and a second level; a second gain control part configured to continuously control a second gain; and a control part configured to control operations of the first gain control part and the second gain control part, wherein a first range of a combined gain of the first gain and the second gain, the first range being obtained with a gain control by the second gain control part with the first gain control part having the first gain set at the first level, and a second range of the combined gain, the second range being obtained with the gain control by the second gain control part with the first gain control part having the first gain set at the second level, have at least an overlap, and the control part is configured to switch the first gain from a first one of the first level and the second level to a second one of the first level and the second level based on a transmission power range determined based on a handover threshold, neighbor radio base station information, and a power level obtained by measuring the reception level of the serving base station and one obtained by scanning the neighbor radio base station.

According to one embodiment of the present invention, a transmission power control method in a radio terminal having a first gain control part configured to have a first gain switchable between a first level and a second level and a second gain control part configured to continuously control a second gain is provided where a first range of a combined gain of the first gain and the second gain, the first range being obtained with a gain control by the second gain control part with the first gain control part having the first gain set at the first level, and a second range of the combined gain, the second range being obtained with the gain control by the second gain control part with the first gain control part having the first gain set at the second level, have at least an overlap, and the first gain is switched from a first one of the first level and the second level to a second one of the first level and the second level in response to the combined gain being within the overlap and a change in the combined gain exceeding a predetermined value, in response to the combined gain being within the overlap and the radio terminal being in a period of no transmission or reception in intermittent transmission or reception, in response to a desired level of the combined gain being in the overlap and a difference between the desired level of the combined gain and one of ends of the first range of the combined gain which one is nearer to the desired level being greater than a difference between the desired level of the combined gain and one of ends of the second range of the combined gain which one is nearer to the desired level, or in response to obtaining a handover threshold, neighbor radio base station information, and a power level obtained by measuring the reception level of the serving base station and one obtained by scanning the neighbor radio base station.

According to one aspect of the present invention, it is possible to reduce the effect of the discontinuity of transmission power at the switching of gain in transmission power control.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
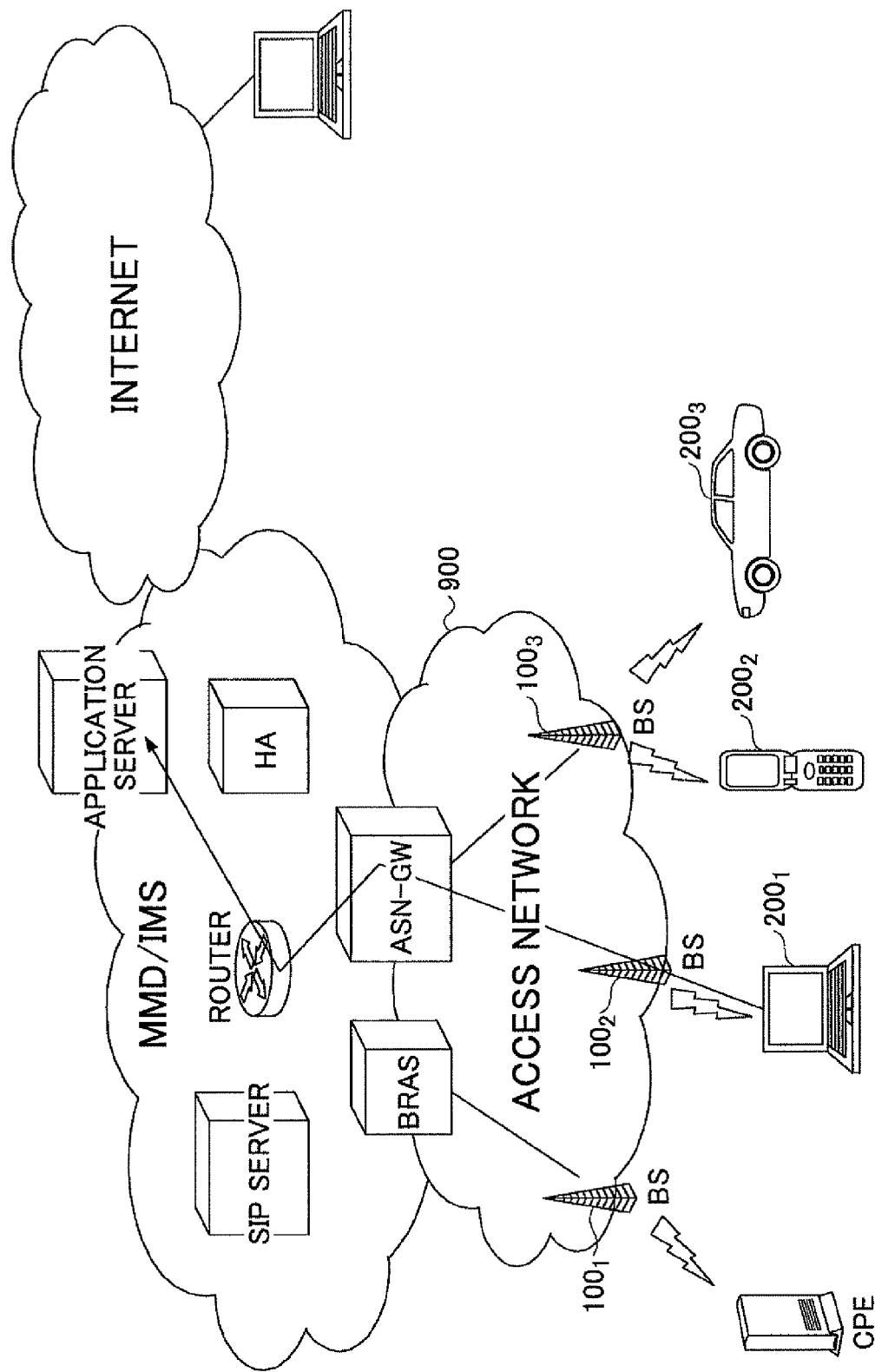
FIG. 1 is a diagram for illustrating a radio communications system according to a first embodiment of the present invention.

A description is given below, with reference to the accompanying drawings, of embodiments of the present invention.

In the drawings for illustrating embodiments, the elements having the same function are referred to by the same reference numeral, and a repetitive description thereof is omitted.

First Embodiment

A description is given of a radio communications system according to a first embodiment of the present invention.

Time Division Duplex (TDD) is applied to the radio communications system according to this embodiment. According to TDD, full duplex communications are performed by switching an uplink and a downlink at time division. An uplink transmission signal and a downlink transmission signal may be transmitted in the same transmission band. For example, a transmission frame (radio frame) in TDD includes a downlink (DL) sub-frame in which a downlink signal is transmitted and an uplink (UL) sub-frame in which an uplink signal is transmitted. Further, each of the downlink sub-frame and the uplink sub-frame includes multiple Orthogonal Frequency Division Multiplexing (OFDM) symbols. The number of OFDM signal symbols included in the downlink sub-frame and the number of OFDM signal symbols included in the uplink sub-frame may be the same or different. A cyclic prefix (CP) is positioned between OFDM symbols. For example, a CP is placed between symbols by adding a signal, which is a direct copy of a signal portion of a predetermined length from the end of a symbol, to the front of the symbol.

Further, OFDM/Orthogonal Frequency Division Multiple Access (OFDMA) is applied to the radio communications system according to this embodiment. Radio communications systems that satisfy these requirements include Worldwide Interoperability for Microwave Access (WiMAX). Accordingly, in this embodiment, a description is given, taking WiMAX as an example radio communications system. The present invention is also applicable to radio communications systems other than WiMAX as long as they include a radio communications device that has a first gain control part capable of dual gain from a first gain (level) to a second gain (level) and a second gain control part capable of continuous gain control.

Referring to FIG. 1, the radio communications system according to this embodiment includes radio base stations (BSs) $100_1$, $100_2$, and $100_3$. For example, the radio base stations $100_1$, $100_2$, and $100_3$ are included in an access network 900. The number of radio base stations may be, but is not limited to, three as in FIG. 1. The number of radio base stations may be one, two, or more than three. Further, the radio communications system according to this embodiment includes radio terminals $200_1$, $200_2$, and $200_3$. The radio terminals $200_1$, $200_2$, and $200_3$ may include a personal computer (PC), a mobile terminal, and an on-vehicle terminal to be provided in a vehicle, which are capable of radio communications. Hereinafter, the radio base stations $100_1$, $100_2$, and $100_3$ may also be collectively referred to as "radio base station(s) 100" for convenience of description. Likewise, the radio terminals $200_1$, $200_2$, and $200_3$ may also be collectively referred to as "radio terminal(s) 200" for convenience of description.

Further, the radio communications system according to this embodiment may also include customer premises equipment (CPE).

Figure 2:
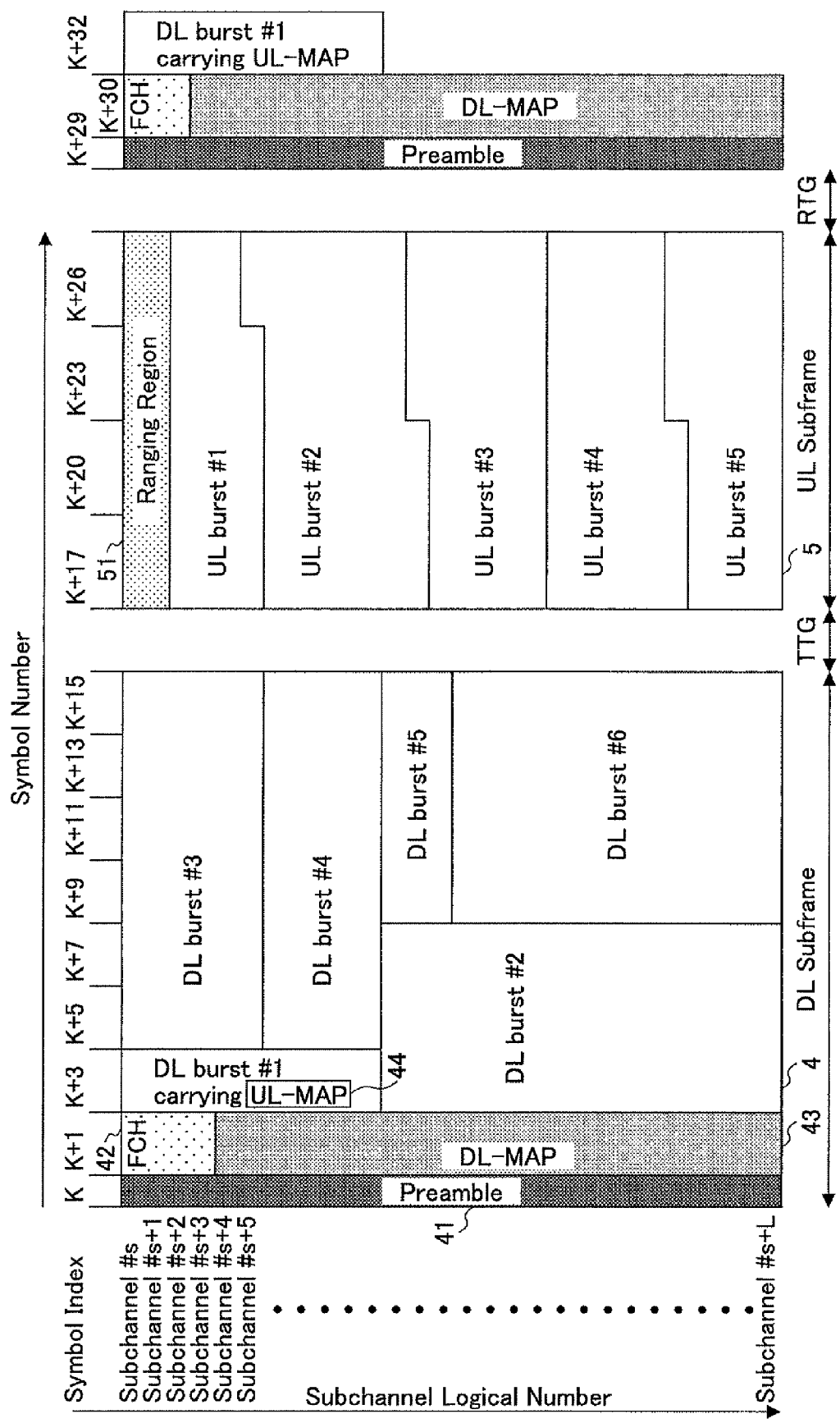
FIG. 2 is a diagram for illustrating a frame format according to the first embodiment of the present invention.

The radio base station 100 and the radio terminal 200 perform radio communications based on TDD. Referring to FIG. 2, which is a diagram showing a frame format according to this embodiment, a transmission frame in TDD includes a downlink subframe (DL subframe) 4 and an uplink subframe (UL subframe) 5. That is, a pair of downlink and uplink subframes forms a single frame. In FIG. 2, the vertical axis represents the subchannel logical number, and the horizontal axis represents the symbol number. Further, one slot is formed of two symbols in the downlink subframe, and one slot is formed of three symbols in the uplink subframe.

The downlink subchannels include a preamble 41, a frame control header (FCH) 42, a downlink map (DL-MAP) 43, an uplink map (UL-MAP) 44, and a downlink burst (DL burst). For example, the FCH 42 may include the number of subchannels and the coding information of the DL-MAP 43. Further, the DL-MAP 43 may include the position and size information of the burst. The downlink burst may be segmented (divided) into multiple regions. In the case shown in FIG. 2, the downlink burst is segmented (divided) into 6 regions (DL burst #1 through DL burst #6). The uplink subchannels include a ranging region 51 and an uplink burst (UL burst). The uplink burst may be segmented (divided) into multiple regions. In the case shown in FIG. 2, the uplink burst is segmented (divided) into five regions (UL burst #1 through UL burst #5).

Figure 3:
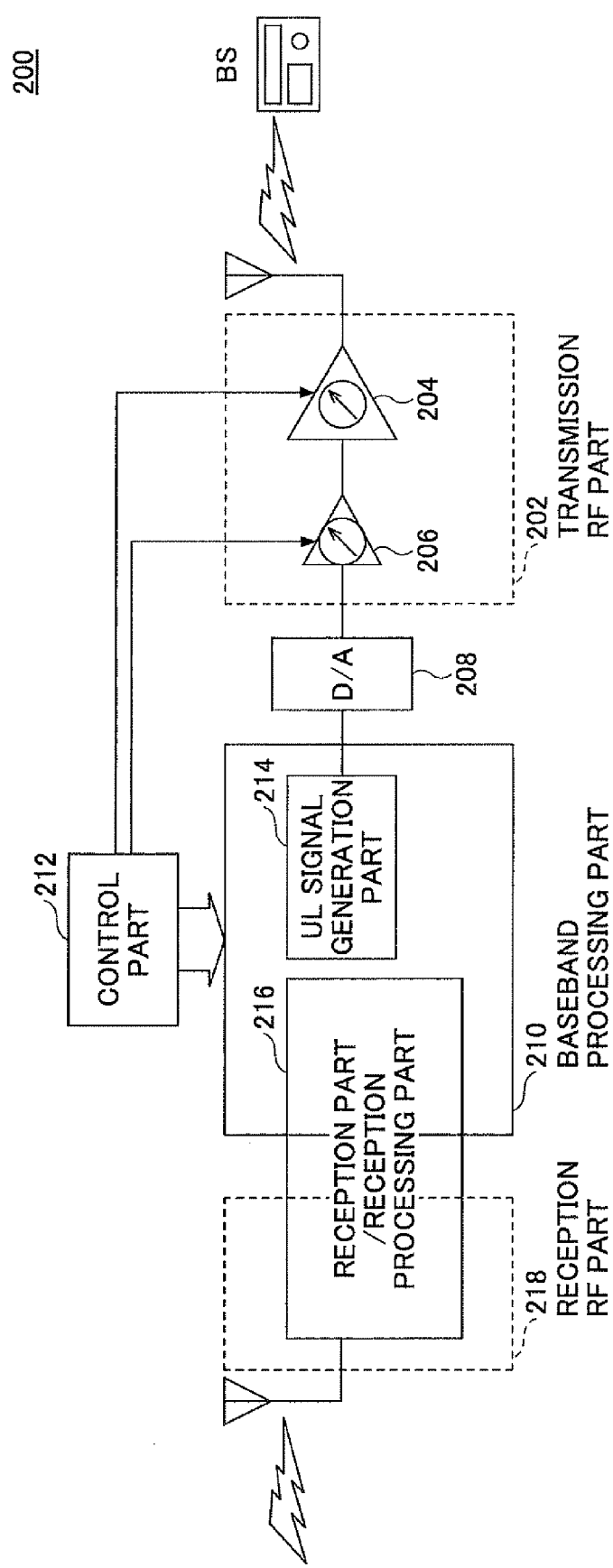
FIG. 3 is a block diagram illustrating part of a radio terminal according to the first embodiment of the present invention.

A description is given, with reference to FIG. 3, of the radio terminal 200 according to this embodiment.

FIG. 3 is a block diagram showing part of the radio terminal 200 according to this embodiment. Referring to FIG. 3, the radio terminal 200 includes a transmission RF part 202. The transmission RF part 202 transmits an uplink signal to the radio base station 100. For example, the transmission RF part 202 converts data subjected to D/A (digital-to-analog) conversion into a radio frequency, and performs transmission power control to transmit the data.

The radio terminal 200 according to this embodiment includes a dual gain amplifier 204. The dual gain amplifier 204 switches gain between two levels.

The radio terminal 200 according to this embodiment includes a continuously variable gain amplifier 206. The continuously variable gain amplifier 206 varies gain continuously.

The radio terminal 200 according to this embodiment includes a D/A converter 208. The D/A converter 208 converts a baseband signal input by a below-described UL signal generation part 214 into an analog signal. The D/A converter 208 inputs the baseband signal converted into an analog signal to the transmission RF part 202.

The radio terminal 200 according to this embodiment includes a baseband processing part 210. The baseband processing part 210 performs processing related to a baseband signal.

The radio terminal 200 according to this embodiment includes a control part 212. The control part 212 controls the gain setting or switching of the above-described dual gain amplifier 204 and continuously variable gain amplifier 206.

The radio terminal 200 according to this embodiment includes the UL signal generation part 214. The UL signal generation part 214 generates an uplink signal. The UL signal generation part 214 inputs the generated uplink signal to the D/A converter 208.

The radio terminal 200 according to this embodiment includes a reception part/reception processing part 216. The reception part/reception processing part 216 performs processing related to a baseband signal input by a reception RF part 218.

The radio terminal 200 according to this embodiment includes the reception RF part 218. The reception RF part 218 converts a downlink signal transmitted by the radio base station 100 into a baseband signal.

The radio terminal 200 according to this embodiment controls transmission power based on the amount of a change in an instruction to control the transmission power.

Figure 4:
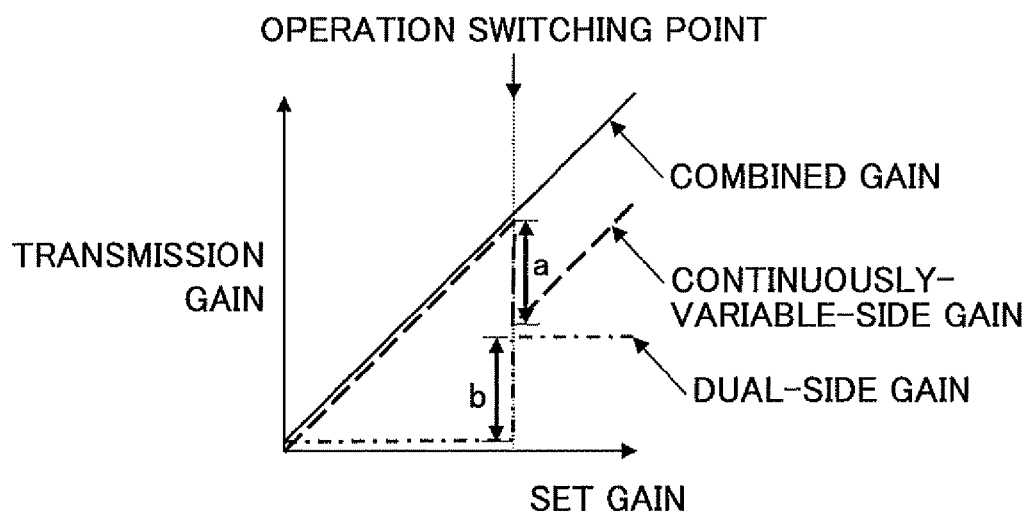
FIG. 4 is a graph illustrating transmission power control.

As described above, the radio terminal 200 according to this embodiment includes the dual gain amplifier 204 and the continuously variable gain amplifier 206. Therefore, the transmission power in the radio terminal 200 is controlled as illustrated in FIG. 4. FIG. 4 is a graph showing the relationship between set gain and transmission gain.

As illustrated in FIG. 4, a final transmission gain (level) is the sum of a gain (level) by the continuously variable gain amplifier 206 that continuously varies gain and a gain (level) by the dual gain amplifier 204 that switches gain between two levels. The variation width of gain may not be covered only by adjustment (control) by the continuously variable gain amplifier 206. Therefore, the gain in the dual gain amplifier 204 is switched at some level of transmission gain. In this case, at the switching point, the gain of the continuously variable gain amplifier 206 is reduced so as to cancel the change in gain by the dual gain amplifier 204. For example, the dual gain amplifier 204 switches gain at the operation switching point as illustrated in FIG. 4. For example, the dual gain amplifier 204 increase gain by b. On the other hand, the continuously variable gain amplifier 206 reduces gain by a in order to cancel the gain change b in the dual gain amplifier 204.

In the case where such control is performed, the amount of reduction of gain in the continuously variable gain amplifier 206 (gain reduction a) and the amount of an increase of gain in the dual gain amplifier 204 (gain increase b) are designed to be equal. Unless such particular action is taken as adjusting gain or correcting gain based on temperature, however, a=b does not necessarily hold because of the individual differences of the amplifiers 204 and 206 or the difference between the changes of the characteristics of the amplifiers 204 and 206 due to an environment.

Figure 5:
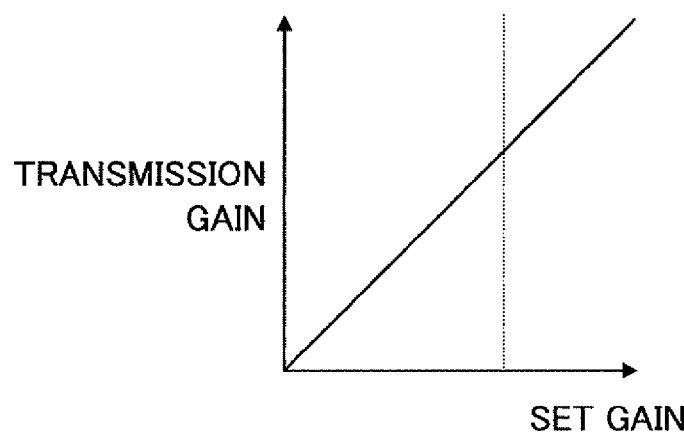
FIG. 5 is a graph illustrating transmission power control.
Figure 6:
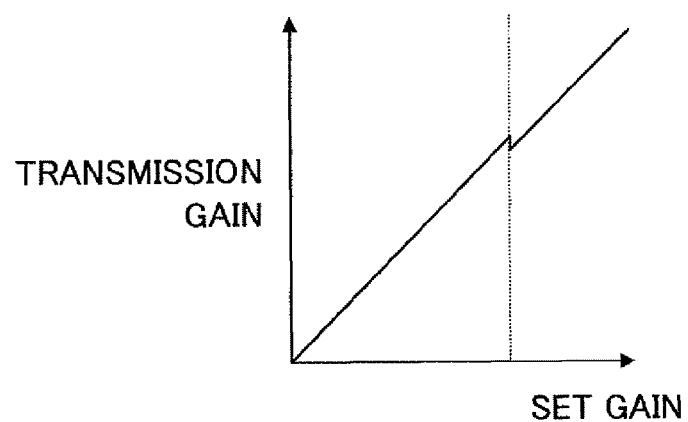
FIG. 6 is a graph illustrating transmission power control.
Figure 7:
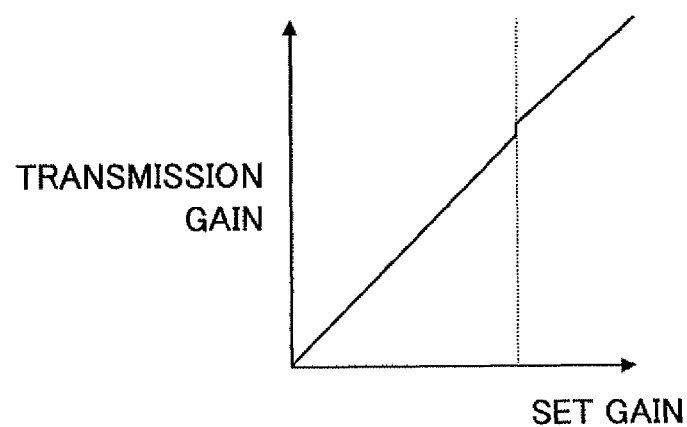
FIG. 7 is a graph illustrating transmission power control.

For example, as illustrated in FIG. 5, if a=b, the transmission gain is smooth relative to the set gain. In other words, the transmission gain increases monotonously as the set gain increases. However, if a>b, the transmission gain temporarily decreases to have a step at the operation switching point as illustrated in FIG. 6. Further, if a<b, the transmission gain temporarily increases to have a step at the operation switching point as illustrated in FIG. 7. Accordingly, if a>b or a<b, the transmission gain is discontinuous relative to the set gain at the operation switching point in accordance with the difference between a and b.

Figure 8:
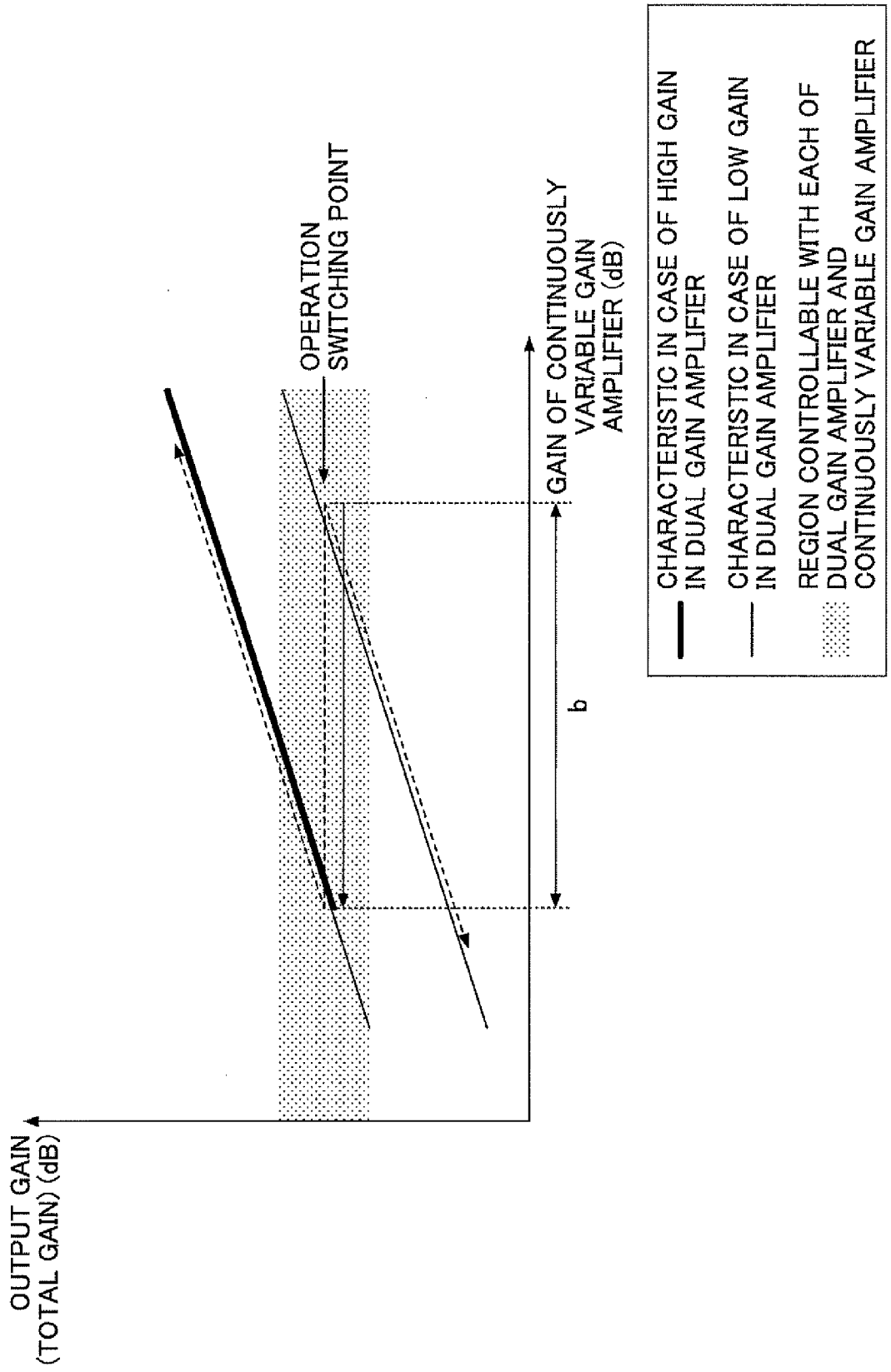
FIG. 8 is a graph illustrating transmission power control according to the first embodiment of the present invention.

A description is given, with reference to FIG. 8, of a gain switching operation in the dual gain amplifier 204. In FIG. 8, the horizontal axis represents gain in the continuously variable gain amplifier 206, and the vertical axis represents transmission gain. The transmission gain may also be referred to as "output gain (total gain)."

FIG. 8 shows a gain curve where the gain in the dual gain amplifier 204 is HIGH and a gain curve where the gain in the dual gain amplifier 204 is LOW.

Switching gain in the dual gain amplifier 204 is indicated by the switching between the characteristic in the case where the gain of the dual gain amplifier 204 is HIGH and the characteristic in the case where the gain of the dual gain amplifier 204 is LOW at the operation switching point. The broken line in FIG. 8 indicates the case of switching gain to HIGH in the dual gain amplifier 204. In this case, the characteristic representing the transmission gain is switched from the characteristic in the case where the gain of the dual gain amplifier 204 is LOW to the characteristic in the case where the gain of the dual gain amplifier 204 is HIGH.

In FIG. 8, REGION CONTROLLABLE WITH EACH OF DUAL GAIN AMPLIFIER AND CONTINUOUSLY VARIABLE GAIN AMPLIFIER is a region selectable in each of the case where the gain of the dual gain amplifier 204 is LOW and the case where the gain of the dual gain amplifier 204 is HIGH. In other words, this region is an overlap of the range of the combined gain (a combination of the gain of the dual gain amplifier 204 and the gain of the continuously variable gain amplifier 206) obtained through gain control by the continuously variable gain amplifier 206 when a first gain (level) is set in the dual gain amplifier 204 (hereinafter referred to as "first combined gain range") and the range of the combined gain obtained through gain control by the continuously variable gain amplifier 206 when a second gain (level) is set in the dual gain amplifier 204 (hereinafter referred to as "second combined gain range").

By way of example, a description is given of the case where the gain in the continuously variable gain amplifier 206 is controllable from −40 dB to 0 dB and the gain in the dual gain amplifier 204 is switchable between −20 dB and 0 dB. In this case, if the gain in the dual gain amplifier 204 is −20 dB, the total gain (combined gain) is controllable between −60 dB and −20 dB. On the other hand, if the gain in the dual gain amplifier 204 is 0 dB, the total gain (combined gain) is controllable between −40 dB and 0 dB. In this case, REGION CONTROLLABLE WITH EACH OF DUAL GAIN AMPLIFIER AND CONTINUOUSLY VARIABLE GAIN AMPLIFIER is the range of −40 dB to −20 dB.

By way of example, a description is given of the case where the operation switching point is set at the center of REGION CONTROLLABLE WITH EACH OF DUAL GAIN AMPLIFIER AND CONTINUOUSLY VARIABLE GAIN AMPLIFIER, that is, −30 dB. In this case, if gain control is insufficient, the transmission gain discontinues relative to the set gain every time the transmission gain passes this operation switching point as a result of transmission power control. For example, the transmission gain may decrease even when the (set) gain is set to increase the transmission gain. On the other hand, the transmission gain may increase even when the (set) gain is set to decrease the transmission gain. Here, the situation of insufficient gain control includes the case where a change in the gain in the dual gain amplifier 204 is not equal to a change in the gain in the continuously variable gain amplifier 206 caused to cancel the change in the gain in the dual gain amplifier 204. It is not preferable for the radio terminal 200 to operate in such a manner.

Therefore, if the transmission power is changed and a gain necessary to obtain the changed transmission power (transmission power after the change) is included in REGION CONTROLLABLE WITH EACH OF DUAL GAIN AMPLIFIER AND CONTINUOUSLY VARIABLE GAIN AMPLIFIER, the radio terminal 200 according to this embodiment performs the following processing.

If the change in transmission power is small, the radio terminal 200 determines gain so as to obtain a desired transmission power level by changing gain in the continuously variable gain amplifier 206. In this case, the radio terminal 200 does not switch gain in the dual gain amplifier 204. On the other hand, if the change in transmission power is relatively large (to some extent), the radio terminal 200 sets gain in the dual gain amplifier 204 so that the gain necessary to obtain the changed transmission power can be controlled over a wide range if the gain in the dual gain amplifier 204 remains the same.

Figure 9:
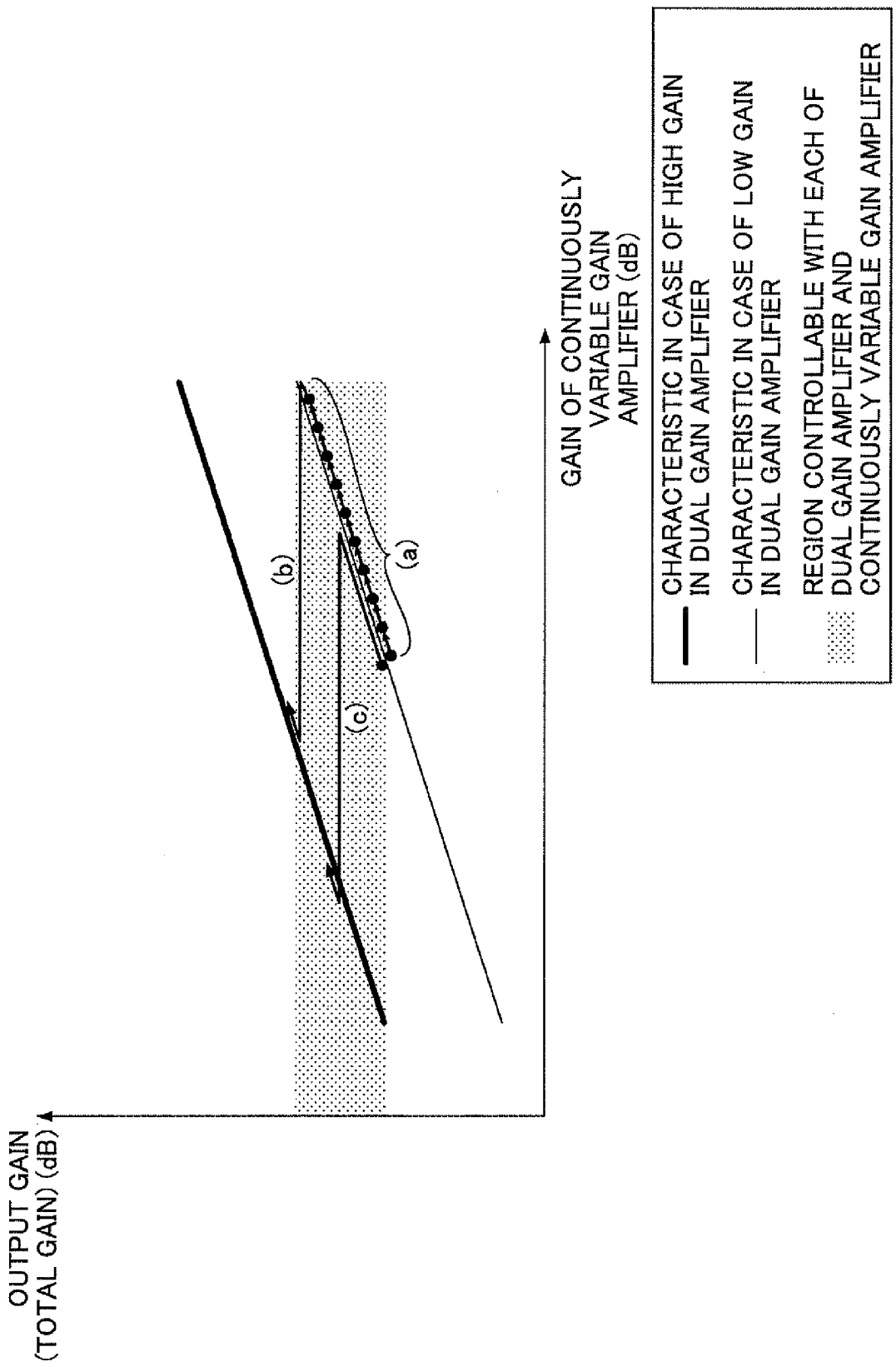
FIG. 9 is a graph illustrating the transmission power control according to the first embodiment of the present invention.

For example, in FIG. 9, (a) shows a transition of the operating point of the output gain in the case where the change in transmission power is small, that is, in the case of changing the transmission power little by little. In this case, a gain corresponding to a desired transmission power level is set by changing gain in the continuously variable gain amplifier 206. When the gain corresponding to the desired transmission power level cannot be achieved by changing gain in the continuously variable gain amplifier 206, the gain in the dual gain amplifier 204 is switched as indicated by (b).

In FIG. 9, (c) shows a transition of the operating point of the output gain in the case where the change in transmission power is relatively large (to some extent). In this case, the gain in the dual gain amplifier 204 is switched before the gain corresponding to the desired transmission power level cannot be achieved by changing gain in the continuously variable gain amplifier 206.

A description is given of a transmission power control method in the radio terminal 200.

Figure 10:
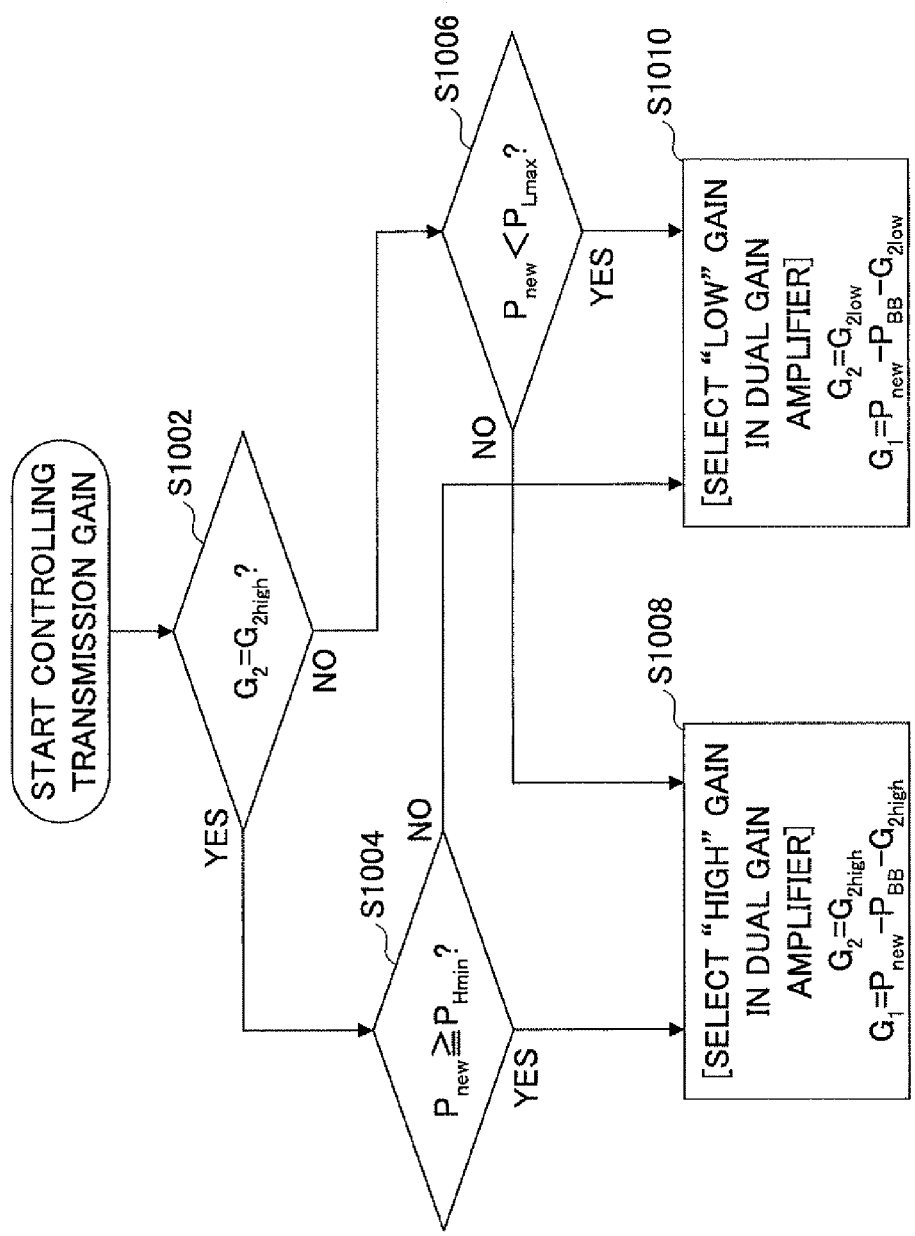
FIG. 10 is a flowchart illustrating a transmission power control method according to the first embodiment of the present invention.

A description is given, with reference to FIG. 10, of a transmission power control method in the case where a change in transmission power is small in amount, that is, a change in transmission power is less than a threshold.

Referring to FIG. 10, in step S1002, the control part 212 (FIG. 3) of the radio terminal 200 determines whether a gain $G_2$ in the dual gain amplifier 204 has been switched to a higher level (HIGH) $G_{2high}$.

If the gain $G_2$ in the dual gain amplifier 204 has been switched to the higher level (HIGH) $G_{2high}$ (YES in step S1002), in step S1004, the control part 212 determines whether a level to which the transmission power is changed (a post-change transmission power level $P_{new}$) is higher than or equal to a transmission power level $P_{Hmin}$ that can be obtained when a gain $G_1$ in the continuously variable gain amplifier 206 is minimized with the gain $G_2$ in the dual gain amplifier 204 being switched to HIGH ($G_{2high}$).

On the other hand, if the gain $G_2$ in the dual gain amplifier 204 has been switched to a lower level (LOW) $G_{2low}$ (NO in step S1002), in step S1006, the control part 212 determines whether the post-change transmission power level $P_{new}$ is lower than a transmission power level $P_{Lmax}$ that can be obtained when the gain $G_1$ in the continuously variable gain is amplifier 206 is maximized with the gain $G_2$ in the dual gain amplifier 204 being switched to LOW ($G_{2low}$).

If the post-change transmission power level $P_{new}$ is higher than or equal to the transmission power level $P_{Hmin}$ that can be obtained when the gain $G_1$ in the continuously variable gain amplifier 206 is minimized with the gain $G_2$ in the dual gain amplifier 204 being switched to HIGH ($G_{2high}$) (YES in step S1004) or if the post-change transmission power level $P_{new}$ is not lower than the transmission power level $P_{Lmax}$ that can be obtained when the gain $G_1$ in the continuously variable gain amplifier 206 is maximized with the gain $G_2$ in the dual gain amplifier 204 being switched to LOW ($G_{2low}$) (NO in step S1006), in step S1008, the control part 212 sets the gain $G_2$ in the dual gain amplifier 204 at HIGH ($G_{2high}$), and sets the gain $G_1$ in the continuously variable gain amplifier 206 at a level obtained by subtracting the higher gain $G_{2high}$ in the dual gain amplifier 204 from the difference between the post-change transmission power level $P_{new}$ and a power level $P_{BB}$ at a total gain of 0 dB ($P_{new} - P_{BB}$).

On the other hand, if the post-change transmission power level $P_{new}$ is not higher than or equal to the transmission power level $P_{Hmin}$ that can be obtained when the gain $G_1$ in the continuously variable gain amplifier 206 is minimized with the gain $G_2$ in the dual gain amplifier 204 being switched to HIGH ($G_{2high}$) (NO in step S1004) or if the post-change transmission power level $P_{new}$ is lower than the transmission power level $P_{Lmax}$ that can be obtained when the gain $G_1$ in the continuously variable gain amplifier 206 is maximized with the gain $G_2$ in the dual gain amplifier 204 being switched to LOW ($G_{2low}$) (YES in step S1006), in step S1010, the control part 212 sets the gain $G_2$ in the dual gain amplifier 204 at LOW ($G_{2low}$), and sets the gain $G_1$ in the continuously variable gain amplifier 206 at a level obtained by subtracting the lower gain $G_{2low}$ in the dual gain amplifier 204 from the difference between the post-change transmission power level $P_{new}$ and the power level $P_{BB}$ at a total gain of 0 dB ($P_{new} - P_{BB}$).

Figure 11:
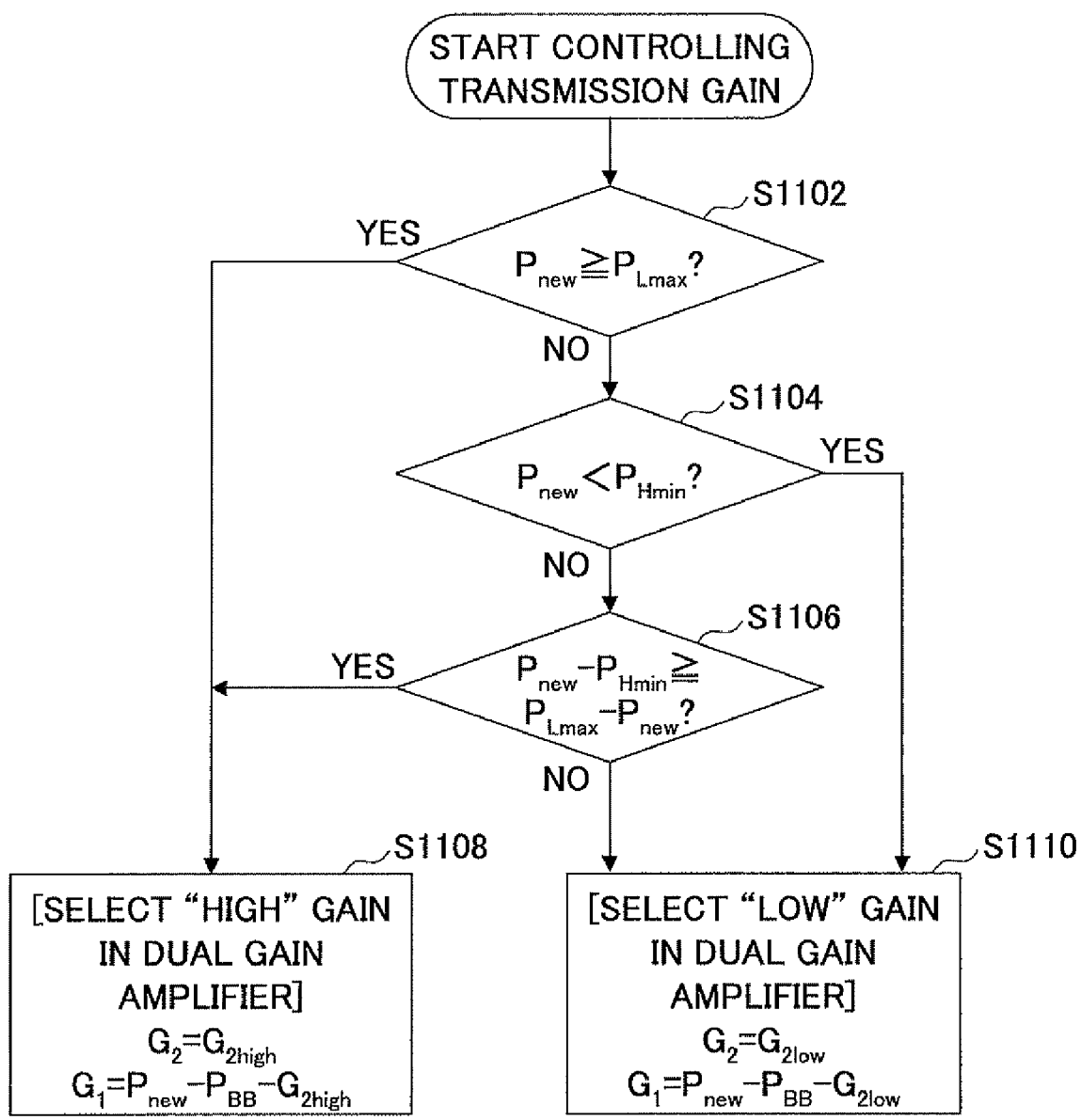
FIG. 11 is a flowchart illustrating a transmission power control method according to the first embodiment of the present invention.

A description is given, with reference to FIG. 11, of a transmission power control method in the case where a change in transmission power is relatively large in amount, that is, a change in transmission power is more than or equal to a threshold.

Referring to FIG. 11, in step S1102, if the gain $G_2$ in the dual gain amplifier 204 has been switched to LOW ($G_{2low}$), the control part 212 (FIG. 3) of the radio terminal 200 determines whether the post-change transmission power level $P_{new}$ is higher than or equal to the transmission power level $P_{Lmax}$ that can be obtained when the gain $G_1$ in the continuously variable gain amplifier 206 is maximized.

If the post-change transmission power level $P_{new}$ is less than the transmission power level $P_{Lmax}$ that can be obtained when the gain $G_1$ in the continuously variable gain amplifier 206 is maximized (NO in step S1102), in step S1104, the control part 212 determines whether the post-change transmission power level $P_{new}$ is lower than the transmission power level $P_{Hmin}$ that can be obtained when the gain $G_1$ in the continuously variable gain amplifier 206 is minimized with the gain $G_2$ in the dual gain amplifier 204 being switched to HIGH ($G_{2high}$).

If the post-change transmission power level $P_{new}$ is higher than or equal to the transmission power level $P_{Hmin}$ that can be obtained when the gain $G_1$ in the continuously variable gain is amplifier 206 is minimized with the gain $G_2$ in the dual gain amplifier 204 being switched to HIGH ($G_{2high}$) (NO in step S1104), in step S1106, the control part 212 determines whether a value obtained by subtracting the transmission power level $P_{Hmin}$ that can be obtained when the gain $G_1$ in the continuously variable gain amplifier 206 is minimized with the gain $G_2$ in the dual gain amplifier 204 being switched to HIGH ($G_{2high}$) from the post-change transmission power level $P_{new}$ is more than or equal to a value obtained by subtracting the post-change transmission power level $P_{new}$ from the transmission power level $P_{Lmax}$ that can be obtained when the gain $G_1$ in the continuously variable gain amplifier 206 is maximized with the gain $G_2$ in the dual gain amplifier 204 being switched to LOW ($G_{2low}$).

If it is determined in step S1102 that the post-change transmission power level $P_{new}$ is more than or equal to the transmission power level $P_{Lmax}$ that can be obtained when the gain $G_1$ in the continuously variable gain amplifier 206 is maximized with the gain $G_2$ in the dual gain amplifier 204 being switched to LOW ($G_{2low}$) (YES in step S1102) or if it is determined in step S1106 that the value obtained by subtracting the transmission power level $P_{Hmin}$ that can be obtained when the gain $G_1$ in the continuously variable gain amplifier 206 is minimized with the gain $G_2$ in the dual gain amplifier 204 being switched to HIGH ($G_{2high}$) from the post-change transmission power level $P_{new}$ is more than or equal to the value obtained by subtracting the post-change transmission power level $P_{new}$ from the transmission power level $P_{Lmax}$ that can be obtained when the gain $G_1$ in the continuously variable gain amplifier 206 is maximized with the gain $G_2$ in the dual gain amplifier 204 being switched to LOW ($G_{2low}$) (YES in step S1106), in step S1108, the control part 212 sets the gain $G_2$ in the dual gain amplifier 204 at HIGH ($G_{2high}$), and sets the gain $G_1$ in the continuously variable gain amplifier 206 at a level obtained by subtracting the higher gain $G_{2high}$ in the dual gain amplifier 204 from the difference between the post-change transmission power level $P_{new}$ and the power level $P_{BB}$ at a total gain of 0 dB ($P_{new}-P_{BB}$).

On the other hand, if it is determined in step S1104 that the post-change transmission power level $P_{new}$ is lower than the transmission power level $P_{Hmin}$ that can be obtained when the gain $G_1$ in the continuously variable gain amplifier 206 is minimized with the gain $G_2$ in the dual gain amplifier 204 being switched to HIGH ($G_{2high}$) (YES in step S1104) or if it is determined in step S1106 that the value obtained by subtracting the transmission power level $P_{Hmin}$ that can be obtained when the gain $G_1$ in the continuously variable gain amplifier 206 is minimized with the gain $G_2$ in the dual gain amplifier 204 being switched to HIGH ($G_{2high}$) from the post-change transmission power level $P_{new}$ is less than the value obtained by subtracting the post-change transmission power level $P_{new}$ from the transmission power level $P_{Lmax}$ that can be obtained when the gain $G_1$ in the continuously variable gain amplifier 206 is maximized with the gain $G_2$ in the dual gain amplifier 204 being switched to LOW ($G_{2low}$) (NO in step S1106), in step S1110, the control part 212 sets the gain $G_2$ in the dual gain amplifier 204 at LOW ($G_{2low}$), and sets the gain $G_1$ in the continuously variable gain amplifier 206 at a level obtained by subtracting the lower gain $G_{2low}$ in the dual gain amplifier 204 from the difference between the post-change transmission power level $P_{new}$ and the power level $P_{BB}$ at a total gain of 0 dB ($P_{new}-P_{BB}$).

As described above, a downlink (DL) and an uplink (UL) are subjected to time division multiplexing in WiMAX. Therefore, transmission is performed intermittently in WiMAX. Accordingly, if it is assumed that a change in transmission power occurs during a period in which transmission of an UL signal is suspended, the accuracy required in transmission power control is lower than in radio systems where UL transmission is successive. In WiMAX, however, at least if power is continuously controlled in closed loop power control, it is desirable to increase or decrease power properly within the range of the fine control. On the other hand, in the case of a power control instruction for a large change, an increase or decrease in transmission gain at an operation switching point, that is, an error is small relative to the deviation of the change. Therefore, even if there is some discontinuity at the operation switching point due to gain switching in the dual gain amplifier 204, the discontinuity can be ignored.

Therefore, according to this embodiment, even if there is a variation or deviation between the gains of two gain control mechanisms, it is possible to reduce the effect of the discontinuity of a control operation due to the deviation.

Second Embodiment

A radio communications system according to a second embodiment of the present invention has the same configuration as the radio communications system described above with reference to FIG. 1.

In the radio communications system according to this embodiment, IEEE 802.16e known as Mobile WiMAX as described above is adopted as a radio communications protocol. Further, in the radio communications system according to this embodiment, the radio terminal 200 includes a WiMAX I/F card and a PC.

Figure 12:
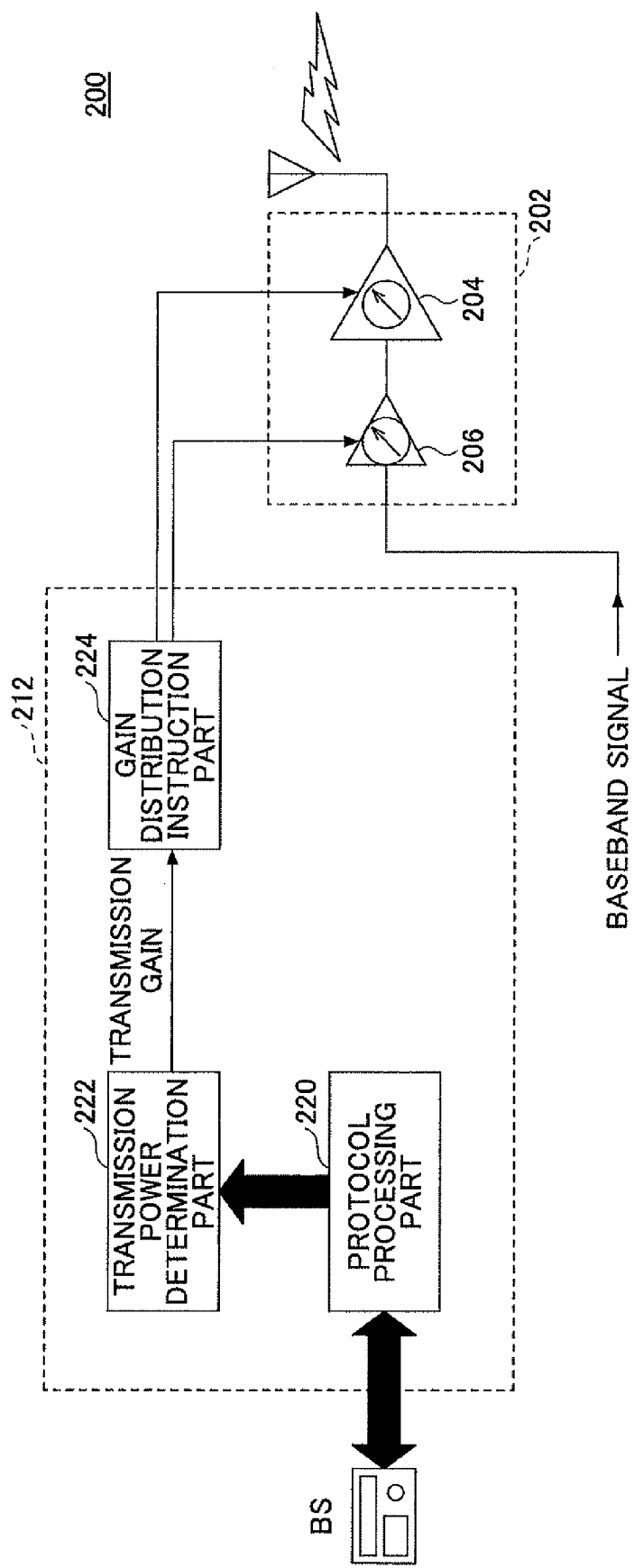
FIG. 12 is a block diagram illustrating part of the radio terminal according to a second embodiment of the present invention.

A description is given, with reference to FIG. 12, of the radio terminal 200 according to this embodiment.

The radio terminal 200 according to this embodiment includes the transmission RF part 202. The transmission RF part 202 transmits an uplink signal to the radio base station 100. For example, the transmission RF part 202 converts data subjected to D/A (digital-to-analog) conversion into a radio frequency, and performs transmission power control to transmit the data.

The radio terminal 200 according to this embodiment includes the dual gain amplifier 204. The dual gain amplifier 204 switches gain between two levels.

The radio terminal 200 according to this embodiment includes the continuously variable gain amplifier 206. The continuously variable gain amplifier 206 varies gain continuously.

The radio terminal 200 according to this embodiment includes the control part 212. The control part 212 controls the gain setting or switching of the above-described dual gain amplifier 204 and continuously variable gain amplifier 206.

The radio terminal 200 according to this embodiment includes a protocol processing part 220. The protocol processing part 220 performs processing of the protocol defined by IEEE 802.16e known as Mobile WiMAX.

The radio terminal 200 according to this embodiment includes a transmission power determination part 222. The transmission power determination part 222 determines transmission power. Further, the transmission power determination part 222 inputs the determined transmission power (level) to a gain distribution instruction part 224. Further, the transmission power determination part 222 determines gain (level) for obtaining the determined transmission power based on the determined transmission power. Further, the transmission power determination part 222 may input the determined gain to the gain distribution instruction part 224.

The radio terminal 200 according to this embodiment includes the gain distribution instruction part 224. The gain distribution instruction part 224 controls the gain setting or switching of the above-described dual gain amplifier 204 and continuously variable gain amplifier 206 based on the gain input by the transmission power determination part 222.

In WiMAX, either closed loop transmission power control or open loop transmission power control is selectable as a method for controlling the transmission power of a radio terminal.

A description is given of the case of applying closed loop transmission power control. In this case, if the transmission power of the radio terminal 200 is off an appropriate value (level), the radio base station 100 may relatively increase transmission power or transmit a control message including an instruction to lower transmission power to the radio terminal 200. In response to reception of the control message transmitted from the radio base station 100, the radio terminal 200 controls transmission power at the time of transmission. Specifically, the transmission power determination part 222 determines transmission power based on the instruction on transmission power included in the control message transmitted from the radio base station 100. Then, the transmission power determination part 222 inputs the determined transmission power to the gain distribution instruction part 224.

The gain distribution instruction part 224 of the radio terminal 200 determines whether a difference from a previous transmission power level is less than or more than or equal to a threshold. If the difference from the previous transmission power level is less than the threshold, the gain distribution instruction part 224 performs the transmission power control described above with reference to FIG. 10. On the other hand, if the difference from the previous transmission power level is more than or equal to the threshold, the gain distribution instruction part 224 performs the transmission power control described above with reference to FIG. 11.

As a result, the gain in the continuously variable gain amplifier 206 and the gain in the dual gain amplifier 204 are determined in the gain distribution instruction part 224.

By way of example, a description is given of the case where the threshold for a change in transmission power is 3 dB. In this case, if the change in transmission power is 2 dB, the transmission power control described above with reference to FIG. 10 is performed. If the change in transmission power is 4 dB, the transmission power control described above with reference to FIG. 11 is performed.

A description is given of the case of applying open loop transmission power control. In this case, the radio terminal 200 adaptively controls transmission power in accordance with a change in the radio field intensity of radio waves from the radio base station 100. For example, it is assumed that if the radio wave from the radio base station 100 decreases by 3 dB, the reception level at the radio base station 100 does not become proper unless the transmission power of the radio terminal 200 increases by the same amount of 3 dB. Accordingly, in this case, the transmission power determination part 222 of the radio terminal 200 determines to increase transmission power by 3 dB. Then, the transmission power determination part 222 inputs the determined transmission power (level) to the gain distribution instruction part 224.

The gain distribution instruction part 224 of the radio terminal 200 determines whether a difference from a previous transmission power level is less than or more than or equal to a threshold. If the difference from the previous transmission power level is less than the threshold, the gain distribution instruction part 224 performs the transmission power control described above with reference to FIG. 10. On the other hand, if the difference from the previous transmission power level is more than or equal to the threshold, the gain distribution instruction part 224 performs the transmission power control described above with reference to FIG. 11.

As a result, the gain in the continuously variable gain amplifier 206 and the gain in the dual gain amplifier 204 are determined in the gain distribution instruction part 224.

Third Embodiment

A radio communications system according to a third embodiment of the present invention has the same configuration as the radio communications system described above with reference to FIG. 1.

At the time of newly connecting to the radio base station 100, continuity with previous power is not important. Accordingly, in the case of determining transmission power in establishing a new connection, the distribution of gain between the two variable gain portions with respect to a power level to be set is determined by the transmission power control method described above with reference to FIG. 11. As a result, after connecting to the radio base station 100, the radio terminal 200 can have a wide margin up to an operating point at which the operation discontinues, so that the radio terminal 200 can perform transmission power control in such a way to be able to reduce the number of cases in which the operating point at which discontinuity occurs is passed.

Figure 13:
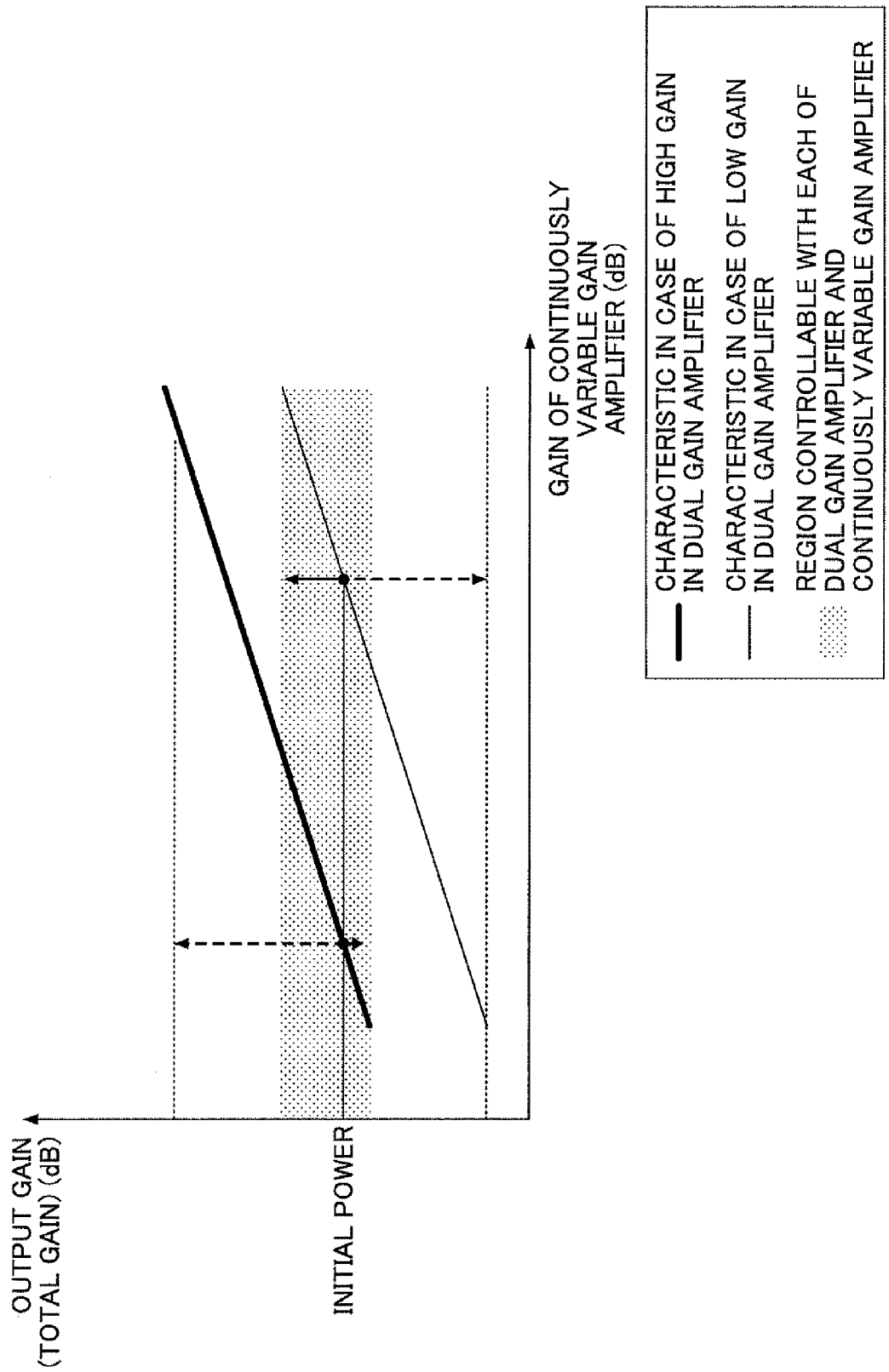
FIG. 13 is a graph illustrating transmission power control according to a third embodiment of the present invention.

Further, in the case of establishing a new connection, the radio terminal 200 makes a connection request. If no response to the connection request is received from the radio base station 100, the radio terminal 200 retransmits the connection request. In this case, the radio terminal 200 may retransmit the connection request at a transmission power level higher than that in the previous connection request. In such a case, since the radio base station 100 has no information on the transmission power level applied in the previously transmitted connection request, the absolute value (level) of transmission power is important in the radio base station 100. That is, in this case, the relative value (level) of transmission power does not make sense. In this case also, the radio terminal 200 determines transmission power by the transmission power control method as described above with reference to FIG. 11. FIG. 13 illustrates the operating point of this operation. The gain distribution instruction part 224 selects an operating point that allows a wider control range in the dual gain amplifier 204. Specifically, the gain distribution instruction part 224 sets the first gain in the dual gain amplifier 204 if a desired combined gain level is in the region controllable with each of the dual gain amplifier 204 and the continuously variable gain amplifier 206 and a gain difference between the desired combined gain level and a nearer one of the ends of the first combined gain range (nearer to the desired combined gain level) is greater than a gain difference between the desired combined gain level and a nearer one of the ends of the second combined gain range (nearer to the desired combined gain level). In the opposite case, that is, if the desired combined gain level is in the region controllable with each of the dual gain amplifier 204 and the continuously variable gain amplifier 206 and the gain difference between the desired combined gain level and the nearer one of the ends of the first combined gain range is smaller than or equal to the gain difference between the desired combined gain level and the nearer one of the ends of the second combined gain range, the gain distribution instruction part 224 sets the second gain in the dual gain amplifier 204.

Likewise, in the case of performing transmission after a sufficient interval since previous transmission, the degree of a variation in radio wave conditions due to an environmental change over time is regarded as greater than a power gap at the discontinuity point. Therefore, the gain may also be determined by the procedure of FIG. 11. The operating point of this operation is the same as that described in FIG. 13.

In WiMAX, the radio terminal 200 starts connecting to the radio base station 100 by transmitting a message called "initial ranging" to the radio base station 100. Transmission of this message is implemented by transmitting a ranging code in a transmission position determined in accordance with a certain procedure in a burst for initial ranging transmission that the radio terminal 200 has been notified of in an UL-MAP message from the radio base station 100. In performing this transmission, the radio terminal 200 determines a proper transmission power level from the radio field intensity of radio waves from the radio base station 100 and the transmission power of the radio base station 100 contained and announced in a message publicized by the radio base station 100. Further, in the case of retransmitting "initial ranging" in response to no reception of a response to "initial ranging" from the radio base station 100, the radio terminal 200 retries the transmission of "initial ranging" at a transmission power level slightly higher than a previous transmission power level. In this sequence, the radio base station 100 cannot recognize a relative difference from the previous transmission power level. Therefore, even if there is a change in transmission power that passes a discontinuity point, the radio base station 100 cannot be aware that the discontinuity point is passed by the change. Therefore, there is no problem even if an increase or decrease in transmission power is inaccurate for the portion of discontinuity. It is rather preferable to control transmission power so as not to pass a discontinuity point as much as possible in subsequent communications with the radio base station 100.

Figure 14:
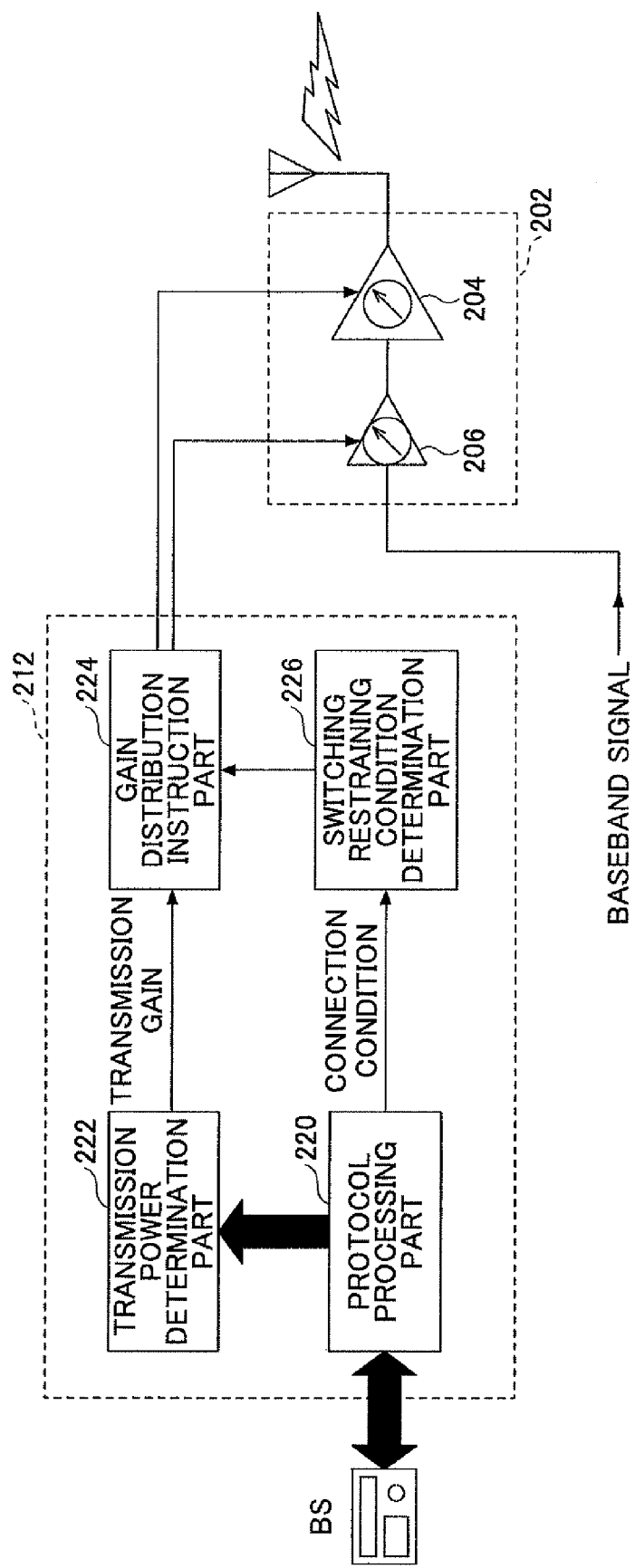
FIG. 14 is a block diagram illustrating part of the radio terminal according to the third embodiment of the present invention.

Therefore, as illustrated in FIG. 14, the radio terminal 200 according to this embodiment further includes a switching restraining condition determination part 226 in addition to the configuration of the radio terminal 200 described above with reference to FIG. 12.

The switching restraining condition determination part 226 transmits a switching restraining instruction to the gain distribution instruction part 224 when it is not preferable to operate over a discontinuity point.

While being connected to the radio base station 100, the switching restraining condition determination part 226 receives a connection condition (status) notification from the protocol processing part 220. Further, the switching restraining condition determination part 226 does not issue a switching restraining instruction during initial ranging, but issues one after completion of connection to the radio base station 100. While the switching restraining instruction is being issued from the switching restraining condition determination part 226, the gain distribution instruction part 224 uses either the sequence described with reference to FIG. 10 or the sequence described with reference to FIG. 11 in accordance with whether a change in transmission power control is less than or more than or equal to a threshold. If no switching restraining instruction is being issued from the switching restraining condition determination part 226, the gain distribution instruction part 224 controls transmission power using the sequence described with reference to FIG. 11.

Further, the protocol processing part 220 determines a time that has elapsed since previous transmission, and transmits a connection condition notification to notify the switching restraining condition determination part 226 of passage of a sufficient time since the previous transmission if the elapsed time exceeds a certain threshold. In response to reception of this connection condition notification, the switching restraining condition determination part 226 stops issuing the switching restraining instruction to the gain distribution instruction part 224.

Then, the gain distribution instruction part 224 controls transmission power with the sequence described with reference to FIG. 11 in next transmission even if the radio terminal 200 is being connected to the radio base station 100. As a result, it is possible to distribute gain between the amplifiers 204 and 206 so as to have a large power control width (range) up to a discontinuity point after connecting to the radio base station 100.

Fourth Embodiment

A radio communications system according to a fourth embodiment of the present invention has the same configuration as the radio communications system described above with reference to FIG. 1.

The procedure for controlling transmission power may be changed although a connection is made to the same radio base station 100. In this case, in general, the continuity of the change of transmission power is not necessary. Accordingly, at the time of such switching of the procedure for controlling transmission power, the distribution of gain between the two variable gain portions is determined with respect to transmission power after switching by the procedure described with reference to FIG. 11. Thereby, it is possible to have a wide margin up to an operating point at which the operation discontinues with respect to subsequent power control, so that it is possible to minimize the number of cases in which the operating point at which discontinuity occurs is passed.

As described above, in WiMAX, each of closed loop transmission power control and open loop transmission power control may be used. However, the latter is treated as an option in the protocol, and a message issued by the radio base station 100 to give an instruction to switch these control procedures is defined. In the same configuration as described above in the third embodiment, the protocol processing part 220 of the radio terminal 200 described with reference to FIG. 14 notifies the switching restraining condition determination part 226 of switching of a transmission power control procedure. Then, the switching restraining condition determination part 226 suspends the switching restraining instruction to the gain distribution instruction part 224 until completion of first transmission after the switching. As a result, in the case of switching a transmission power control procedure, the transmission power is controlled with the sequence described with reference to FIG. 11 without using a procedure for avoiding passing a discontinuity point in the first transmission. The procedure for avoiding passing a discontinuity point is desired in the case of considering the accuracy of a difference in power from previous transmission. Here, the switching of the transmission power control procedure includes, for example, a transition from closed loop transmission power control to open loop transmission power control. After switching the transmission power control procedure, the gain distribution instruction part 224 determines distribution of gain so as to have a large power control width (range) up to a discontinuity point.

Fifth Embodiment

A radio communications system according to a fifth embodiment of the present invention has the same configuration as the radio communications system described above with reference to FIG. 1.

The radio communications system according to this embodiment supports a handover or handoff (H/O). Further, in the radio communications system according to this embodiment, the radio terminal 200 does not start power control with a radio base station 100 that is a handover destination (hereinafter referred to as "handover destination radio base station 100") from an initial connection procedure. Specifically, the radio terminal 200 receives parameters related to power control in advance, and predetermines transmission power for transmission to the handover destination radio base station 100. Then, the radio terminal 200 according to this embodiment determines distribution of gain between the two variable gain portions with respect to an indicated power value indicating the predetermined power by the procedure described with reference to FIG. 11. As a result, the radio terminal 200 can have a wide margin up to an operating point at which the operation discontinues with respect to power control after a handover, so that the radio terminal 200 can minimize the number of cases in which the operating point at which discontinuity occurs is passed.

In WiMAX, information on radio base stations 100 that are candidates for an H/O destination (hereinafter, H/O candidate radio base stations) is transmitted to the radio terminal 200. This information includes the transmission power value (level) of each H/O candidate radio base station 100. The information on H/O candidate radio base stations 100 may also be referred to as neighbor radio base station information. Then, the radio terminal 200 scans signals transmitted from the neighbor (H/O candidate) radio base stations 100 in advance based on the neighbor radio base station information before conducting an H/O. Thereby, the radio terminal 200 can determine whether it is possible to perform communications with the neighbor radio base stations 100 at sufficient reception levels. Further, at this point, the radio terminal 200 measures the radio field intensity of a radio wave received from each radio base station 100. The radio field intensity of the received radio wave includes, for example, a received signal strength indicator (RSSI).

Then, the radio terminal 200 determines a power level for transmission to the H/O destination radio base station 100 by changing a power level for transmission to a current radio base station 100 before the H/O by:

(Transmission Power of H/O Destination Radio Base Station 100)−(RSSI of H/O Destination Radio Base Station 100)−((Transmission Power of Current Radio Base Station 100)−(RSSI of Current Radio Base Station 100)).

As a result, the transmission power is adjusted to an appropriate level without performing any particular power control when connecting to the H/O destination radio base station 100.

The radio terminal 200 according to this embodiment has the same configuration as that described with reference to FIG. 14.

The radio terminal 200 transmits control results to the H/O destination radio base station 100 at the determined transmission power level. In this case, the protocol processing part 220 of the radio terminal 200 notifies the switching restraining condition determination part 226 of occurrence of an H/O. Then, the switching restraining condition determination part 226 suspends the switching restraining instruction to the gain distribution instruction part 224 before completion of first transmission after the H/O. The gain distribution instruction part 224 controls transmission power by the sequence described with reference to FIG. 11 even if the post-H/O transmission power level is substantially equal to the pre-H/O transmission power level. In other words, in the first transmission, the gain distribution instruction part 224 does not use the procedure for avoiding passing a discontinuity point, which procedure is desired in the case of considering the accuracy of a difference in power from previous transmission. As a result, with respect to the H/O destination radio base station 100, the gain distribution instruction part 224 determines the distribution of gain between the amplifiers 204 and 206 so as to have a large power width (range) up to a discontinuity point.

Sixth Embodiment

A radio communications system according to a sixth embodiment of the present invention has the same configuration as the radio communications system described above with reference to FIG. 1.

The radio communications system according to this embodiment supports an H/O. In the radio communications system according to this embodiment, the radio terminal 200 determines an H/O destination radio base station after receiving or obtaining parameters related to power control with multiple radio base stations 100 that are candidates for the H/O destination radio base station. In this case, the radio terminal 200 predetermines an initial transmission power level for connecting to each H/O candidate radio base station 100. If the transmission power level for the H/O destination radio base station 100 is in REGION CONTROLLABLE WITH EACH OF DUAL GAIN AMPLIFIER AND CONTINUOUSLY VARIABLE GAIN AMPLIFIER described above, the radio terminal 200 determines transmission power based on the distribution of the initial transmission power levels for connecting to the other H/O candidate radio base stations 100. For example, the radio terminal 200 sets gain in the dual gain amplifier 204 to LOW even in the region where either gain level is selectable. This is because the radio terminal 200 may be able to conduct an H/O to another radio base station 100 with which communications are performable at a lower transmission power level even if the radio terminal 200 moves away from the radio base station 100 determined as an H/O destination and needs a higher transmission power level because of an increase in the distance from the radio base station 100 due to the movement. For example, the radio terminal 200 conducts an H/O to another radio base station 100 with which communications are performable at a lower transmission power level before it is necessary to increase transmission power to a region (range) where a necessary transmission power level is not obtainable unless the gain in the dual gain amplifier 204 is HIGH. As a result, the radio terminal 200 can conduct an H/O before passing the discontinuity point of transmission power control, so that the radio terminal 200 does not have to pass the discontinuity point.

Figure 15:
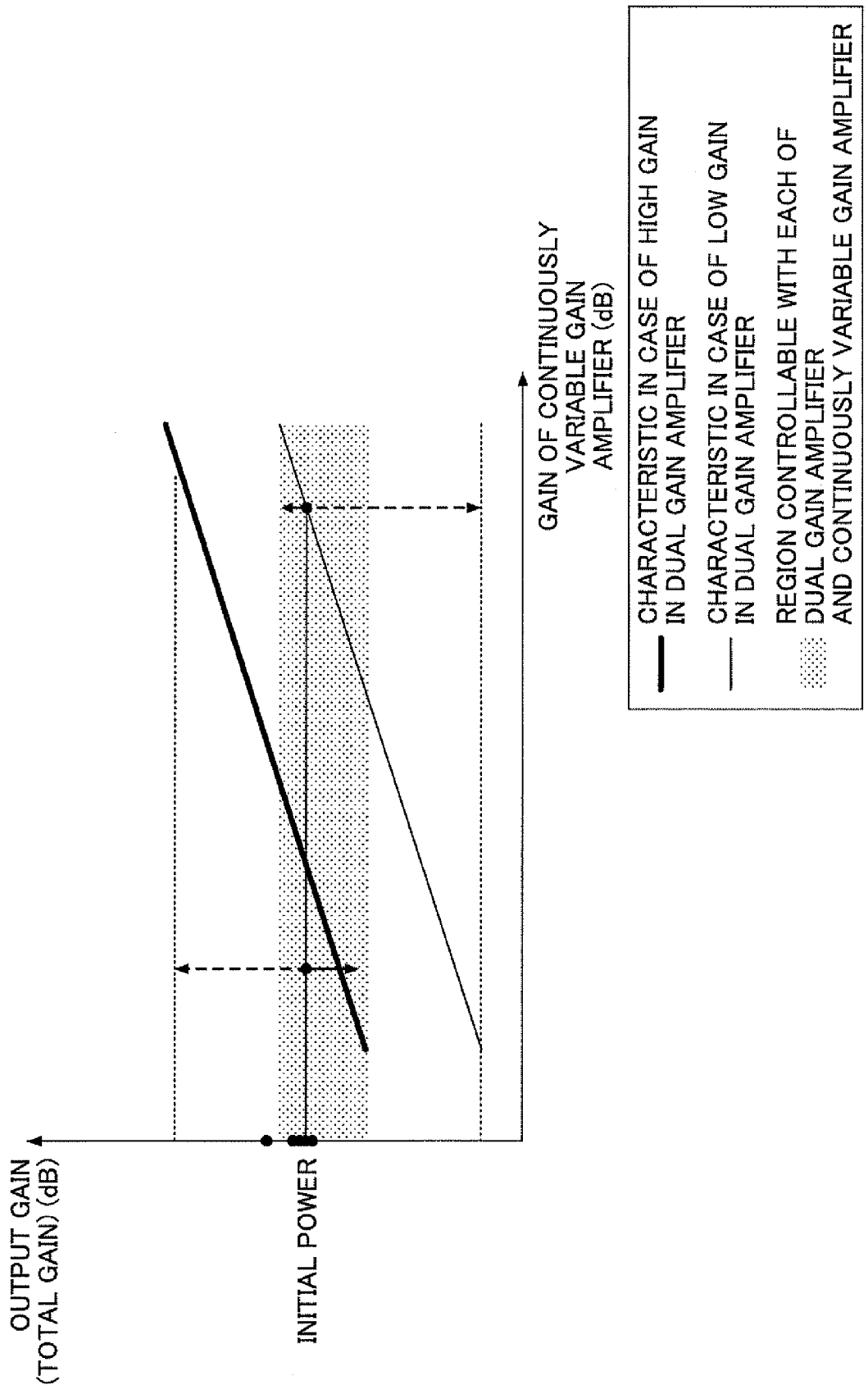
FIG. 15 is a graph illustrating transmission power control according to a sixth embodiment of the present invention.

Thus, in the case of conducting an H/O, the radio terminal 200 determines the gain level of the dual gain amplifier 204 based on transmission power levels necessary in the case of connecting to other radio base stations 100. Thereby, the radio terminal 200 can minimize the number of cases in which the operating point at which discontinuity occurs is passed. FIG. 15 illustrates an operation in this case. If a desired combined gain level is in the region controllable with each of the dual gain amplifier 204 and the continuously variable gain amplifier 206, the gain distribution instruction part 224 sets the first gain in the dual gain amplifier 204 irrespective of whether a gain difference between the desired combined gain level and a nearer one of the ends of the first combined gain range is greater than a gain difference between the desired combined gain level and a nearer one of the ends of the second combined gain range. For example, the first gain is the lower gain level in the dual gain amplifier 204.

In WiMAX, the radio terminal can calculate an appropriate transmission power level for transmission to an H/O candidate radio base station 100.

Figure 16:
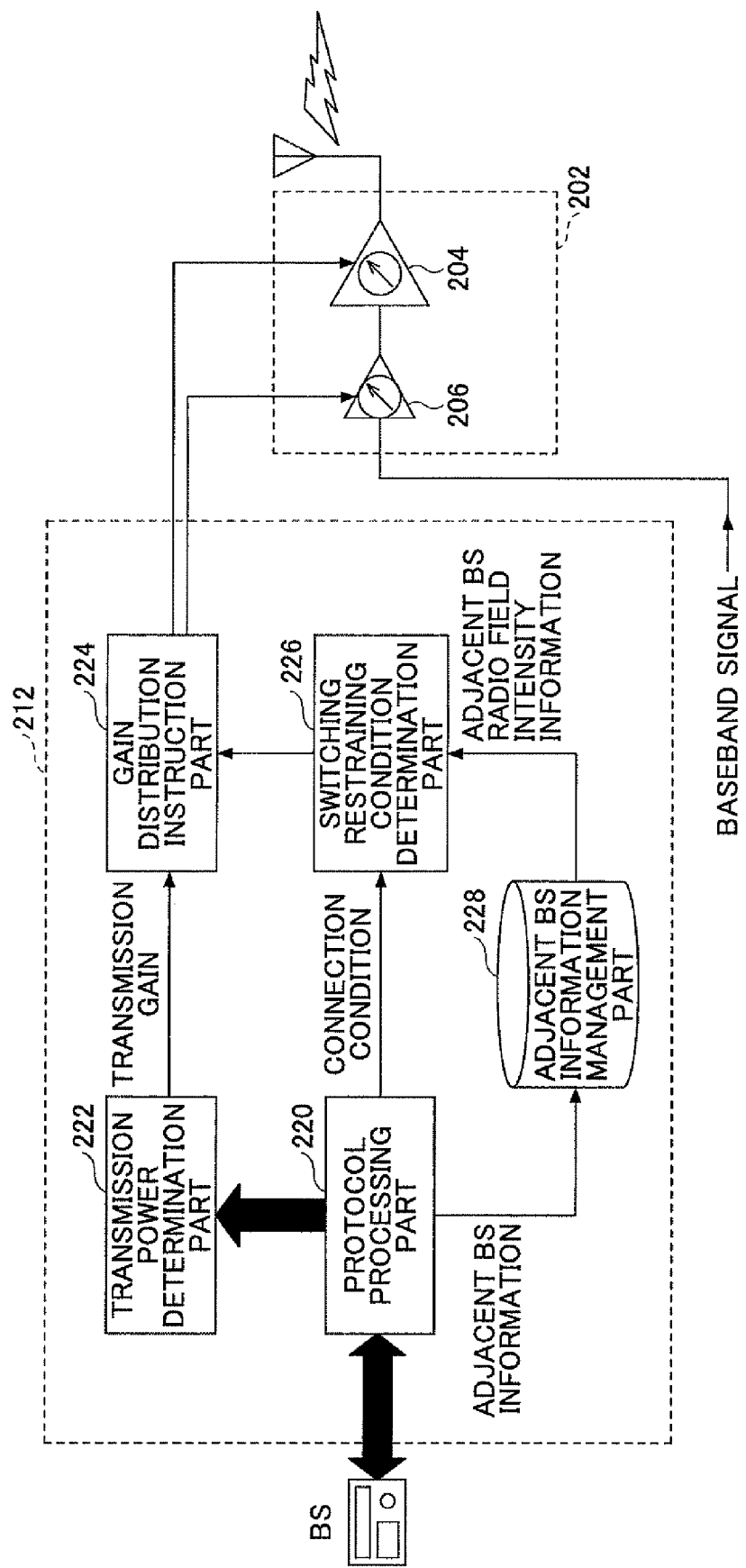
FIG. 16 is a block diagram illustrating part of the radio terminal according to the sixth embodiment of the present invention.

As illustrated in FIG. 16, the radio terminal 200 according to this embodiment further includes an adjacent (neighbor) BS information management part 228 in addition to the configuration of the radio terminal 200 described with reference to FIG. 14. The adjacent BS information management part 228 retains an appropriate initial transmission power level in each radio base station 100.

The switching retaining condition determination part 226 checks the initial transmission power level for transmission to each H/O candidate radio base station 100 in response to receiving a notification of conducting an H/O from the protocol processing part 220. Further, if it can be determined that communications are performable at a sufficiently low transmission power level even if another H/O occurs, the switching retaining condition determination part 226 instructs the gain distribution instruction part 224 to select the lower gain level (LOW) in the dual gain amplifier 204. In response to reception of this instruction, the gain distribution instruction part 224 instructs setting the gain in the dual gain amplifier 204 to LOW and instructs setting the gain in the continuously variable gain amplifier 206 to a level that achieves a desired transmission power level when the gain in the dual gain amplifier 204 is set to LOW, without depending on the sequence described with reference to FIG. 10 or FIG. 11.

A condition for "determining that communications are performable at a sufficiently low transmission power level even if another H/O occurs" may be, for example, that the initial transmission power level for each of more than two other radio base stations 100 is lower than the middle (center) of REGION CONTROLLABLE WITH EACH OF DUAL GAIN AMPLIFIER AND CONTINUOUSLY VARIABLE GAIN AMPLIFIER. Further, the gain distribution instruction part 224 may learn the correlation between the initial transmission power levels for adjacent radio base stations 100 in the case where the gain in the dual gain amplifier 204 remains LOW during the period between the last and next H/O occurrences, and dynamically change the threshold.

By performing such control, the radio terminal 200 can prevent occurrence of discontinuous transmission power control due to simply determining, based only on the transmission power value (level) for transmission to the H/O destination radio base station 100, that the gain in the dual gain amplifier 204 be HIGH when such a case occurs where it is sufficient to keep the gain in the dual gain amplifier 204 LOW.

In the above-described first through sixth embodiments, as a measure for "a large (wide) power control width (range)," decibel (dB) values of transmission power may be simply employed for comparison. Alternatively, a larger width may be determined based on a linear-value representation of power, such as mW. Further, a measure convenient for ensuring output characteristics may also be introduced separately.

Seventh Embodiment

A radio communications system according to a seventh embodiment of the present invention has the same configuration as the radio communications system described above with reference to FIG. 1.

Figure 17:
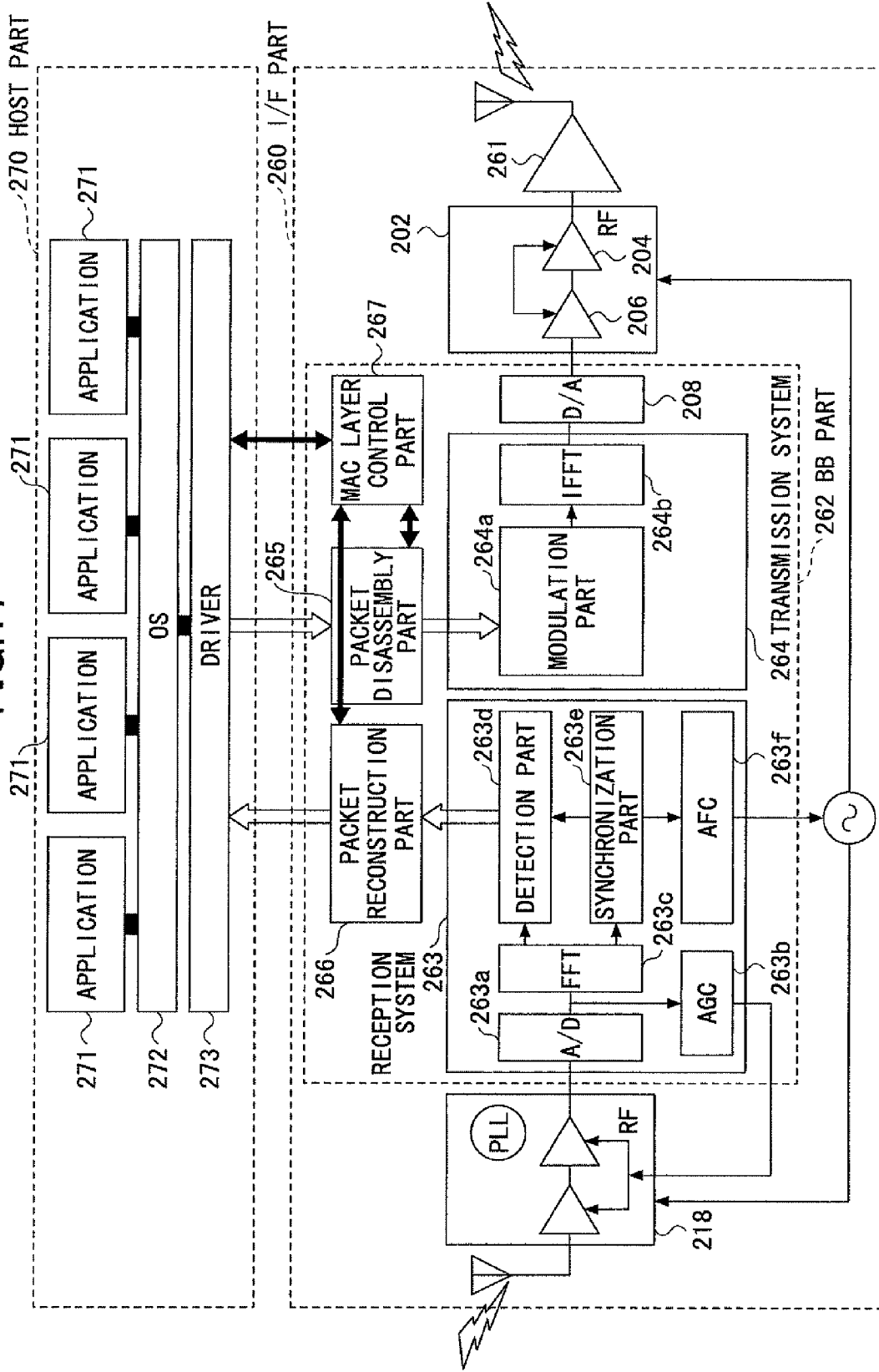
FIG. 17 is a block diagram illustrating part of the radio terminal according to a seventh embodiment of the present invention.

As illustrated in FIG. 17, the radio terminal 200 according to this embodiment includes a host part 270 and an I/F (interface) part 260. Transmission power control is performed by software on the host part 270 side. Specifically, the host part 270 includes multiple applications 271 that implement the functions of the above-described first through sixth embodiments, so that power control is performed. The host part 270 also includes an operating system (OS) 272 and a driver 273.

Further, the I/F part 260 performs transmission power control with the continuously variable gain amplifier 206 and the dual gain amplifier 204. Specifically, the I/F part 260 performs transmission power control as described above in the first through sixth embodiments. Thereby, it is possible to control the gain of the RF transmission part 202. In addition to the RF transmission part 202, the I/F part 260 includes a transmission amplifier 261, a baseband (BB) part 262, and the reception RF part 218. The baseband part 262 includes the D/A converter 208, a reception system 263, a transmission system 264, a packet disassembly part 265, a packet reconstruction part 266, and a MAC layer control part 267. The reception system 263 includes an A/D converter 263a, an automatic gain controller (AGC) 263b, an FFT (Fast Fourier Transform) part 263c, a detection part 263d, a synchronization part 263e, and an automatic frequency controller (AFC) 263f. The transmission system 264 includes a modulation part 264a and an IFFT (Inverse Fast Fourier Transform) part 264b.

According to any of the above-described embodiments, it is possible to minimize the number of occurrences of transmission power control that passes an operating point at which transmission power changes discontinuously, and under normal operations, it is possible to substantially prevent the occurrence of such transmission power control. Therefore, it is possible to achieve a desired power control capability without having a particular mechanism for eliminating a potentially-existing point of discontinuity of power control using calibration or the like in a simple transmission circuit configuration of two gain varying mechanisms of continuous variation and two-level variation.

Further, by providing the transmission circuit of a radio terminal device with a gain control part configured to vary gain continuously and a gain control part configured to switch gain between two levels, it is possible to avoid a point of discontinuity of power control even in a circuit configuration potentially having a factor of operational discontinuity by not using a point at which the change of transmission power discontinues based on power values for connecting to radio base stations or information on adjacent (neighbor) radio base stations.

According to one aspect of the present invention, it is possible to reduce the effect of the discontinuity of transmission power at the switching of gain in transmission power control.

The present invention is not limited to the specifically disclosed embodiments, and variations and modifications may be made without departing from the scope of the present invention.

The present application is based on Japanese Priority Patent Application No. 2008-053336, filed on Mar. 4, 2008, the entire contents of which are hereby incorporated by reference.

What is claimed is:

1. A radio terminal, comprising:
   a first gain control part configured to have a first gain switchable between a first level and a second level;
   a second gain control part configured to continuously control a second gain; and
   a control part configured to control operations of the first gain control part and the second gain control part,
   wherein a first range of a combined gain of the first gain and the second gain, the first range being obtained with a gain control by the second gain control part with the first gain control part having the first gain set at the first level, and a second range of the combined gain, the second range being obtained with the gain control by the second gain control part with the first gain control part having the first gain set at the second level, have at least an overlap, and
   the control part is configured to switch the first gain from one of the first level and the second level to another one of the first level and the second level in response to the combined gain being within the overlap and a change required for the combined gain exceeding a predetermined value, or in response to the combined gain being within the overlap and the radio terminal being in a period of no transmission or reception in a situation of intermittent transmission or reception.

2. The radio terminal as claimed in claim 1, wherein a control range of transmission power from the power at the combined gain is wider with the other one of the first level and the second level than with the one of the first level and the second level.

3. A radio terminal, comprising:
   a first gain control part configured to have a first gain switchable between a first level and a second level;
   a second gain control part configured to continuously control a second gain; and
   a control part configured to control operations of the first gain control part and the second gain control part,
   wherein a first range of a combined gain of the first gain and the second gain, the first range being obtained with a gain control by the second gain control part with the first gain control part having the first gain set at the first level, and a second range of the combined gain, the second range being obtained with the gain control by the second gain control part with the first gain control part having the first gain set at the second level, have at least an overlap, and the control part is configured to set the first gain at the first level in the first gain control part in response to a desired level of the combined gain being in the overlap and a difference between the desired level of the combined gain and one of ends of the first range of the combined gain which one is nearer to the desired level being greater than a difference between the desired level of the combined gain and one of ends of the second range of the combined gain which one is nearer to the desired level.

4. A radio terminal, comprising:

a first gain control part configured to have a first gain switchable between a first level and a second level;

a second gain control part configured to continuously control a second gain; and a control part configured to control operations of the first gain control part and the second gain control part, wherein a first range of a combined gain of the first gain and the second gain, the first range being obtained with a gain control by the second gain control part with the first gain control part having the first gain set at the first level, and a second range of the combined gain, the second range being obtained with the gain control by the second gain control part with the first gain control part having the first gain set at the second level, have at least an overlap, and the control part is configured to switch the first gain from one of the first level and the second level to another one of the first level and the second level based on a transmission power range determined based on a handover threshold, neighbor radio base station information, and a power level obtained by measuring a reception level of a serving base station and one obtained by scanning a neighbor base station.

5. The radio terminal as claimed in claim 4, wherein the control part is configured to switch the first gain from the one of the first level and the second level to the other one of the first level and the second level so as to widen a coverage of the transmission power range.

6. The radio terminal as claimed in claim 4, wherein the control part is configured to set the first gain to a lower one of the first level and the second level when some of the transmitting power required to handover to each neighbor radio base station are covered at the control range of transmission power with the first gain set to the lower one of the first level and the second level.

7. A transmission power control method in a radio terminal having a first gain control part configured to have a first gain switchable between a first level and a second level and a second gain control part configured to continuously control a second gain, wherein:

a first range of a combined gain of the first gain and the second gain, the first range being obtained with a gain control by the second gain control part with the first gain control part having the first gain set at the first level, and a second range of the combined gain, the second range being obtained with the gain control by the second gain control part with the first gain control part having the first gain set at the second level, have at least an overlap, and the first gain is switched from a first one of the first level and the second level to a second one of the first level and the second level in response to the combined gain being within the overlap and a change in the combined gain exceeding a predetermined value, in response to the combined gain being within the overlap and the radio terminal being in a period of no transmission or reception in intermittent transmission or reception, in response to a desired level of the combined gain being in the overlap and a difference between the desired level of the combined gain and one of ends of the first range of the combined gain which one is nearer to the desired level being greater than a difference between the desired level of the combined gain and one of ends of the second range of the combined gain which one is nearer to the desired level, or in response to obtaining a handover threshold, neighbor radio base station information, and a power level obtained by measuring a reception level of a serving base station and one obtained by scanning a neighbor base station.

* * * * *